(12) United States Patent
Ebisawa et al.

(10) Patent No.: US 10,890,845 B2
(45) Date of Patent: Jan. 12, 2021

(54) CHEMICALLY AMPLIFIED POSITIVE-TYPE PHOTOSENSITIVE RESIN COMPOSITION

(71) Applicant: TOKYO OHKA KOGYO CO., LTD., Kawasaki (JP)

(72) Inventors: Kazuaki Ebisawa, Kawasaki (JP); Yuta Yamamoto, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 210 days.

(21) Appl. No.: 15/499,026

(22) Filed: Apr. 27, 2017

(65) Prior Publication Data

US 2017/0322489 A1 Nov. 9, 2017

(30) Foreign Application Priority Data

May 6, 2016 (JP) ................................. 2016-093478

(51) Int. Cl.
*G03F 7/004* (2006.01)
*G03F 7/20* (2006.01)
(Continued)

(52) U.S. Cl.
CPC ........ *G03F 7/0392* (2013.01); *C23C 18/1605* (2013.01); *C23C 18/1633* (2013.01); *C25D 5/022* (2013.01); *G03F 7/0045* (2013.01); *G03F 7/0046* (2013.01); *G03F 7/0397* (2013.01); *G03F 7/16* (2013.01); *G03F 7/168* (2013.01);
(Continued)

(58) Field of Classification Search
CPC .... G03F 7/0045; G03F 7/0046; G03F 7/0392; G03F 7/16; G03F 7/38; G03F 7/40; G03F 7/168; G03F 7/322; G03F 7/2004; C23C 18/1633
See application file for complete search history.

(56) References Cited

U.S. PATENT DOCUMENTS

2008/0085464 A1* 4/2008 Shibuya ................... C08F 2/38
430/270.1
2015/0268553 A1* 9/2015 Katayama ............... G03F 7/322
430/285.1

FOREIGN PATENT DOCUMENTS

| JP | H09-176112 | 7/1997 |
| JP | H11-052562 | 2/1999 |
| TW | 200819917 A | 5/2008 |

OTHER PUBLICATIONS

Office Action issued in Taiwanese Patent Application No. 106114830, dated Nov. 12, 2020.

* cited by examiner

*Primary Examiner* — Bijan Ahvazi
(74) *Attorney, Agent, or Firm* — Knobbe Martens Olson & Bear LLP

(57) ABSTRACT

A chemically amplified positive-type photosensitive resin composition capable of suppressing occurrence of footing in which the width of the bottom becomes narrower than that of the top in a nonresist section, denaturation of the surface of the metal substrate, and occurrence of a development residue, when a resist pattern serving as a template for a plated article is formed on a metal surface of the substrate having the metal surface by using the composition; a method for manufacturing a substrate with a template by using the composition; and a method for manufacturing a plated article using the substrate with the template. A mercapto compound having a specific structure is contained in the chemically resin composition which includes an acid generator, and a resin whose solubility in alkali increases under the action of acid.

5 Claims, 1 Drawing Sheet

(51) Int. Cl.
*G03F 7/32* (2006.01)
*C23C 18/16* (2006.01)
*G03F 7/039* (2006.01)
*C25D 5/02* (2006.01)
*G03F 7/16* (2006.01)
*G03F 7/38* (2006.01)
*G03F 7/40* (2006.01)

(52) U.S. Cl.
CPC ............ *G03F 7/2004* (2013.01); *G03F 7/322* (2013.01); *G03F 7/38* (2013.01); *G03F 7/40* (2013.01)

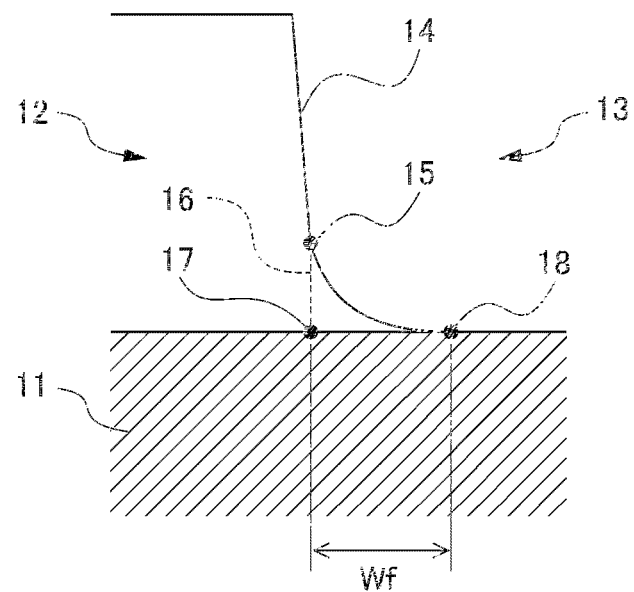

US 10,890,845 B2

CHEMICALLY AMPLIFIED POSITIVE-TYPE PHOTOSENSITIVE RESIN COMPOSITION

RELATED APPLICATION

This application claims priority to Japanese Patent Application No. 2016-093478, filed May 6, 2016, the entire content of which is incorporated herein by reference.

BACKGROUND OF THE INVENTION

Field of the Invention

The present invention relates to a chemically amplified positive-type photosensitive resin composition, a method of manufacturing a substrate with a template by using the above chemically amplified positive-type photosensitive resin composition and a method of manufacturing a plated article by using the above substrate with the template.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, and/or electroforming based mainly on electroplating, using the patterned photoresist layer (resist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition, (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

These chemically amplified positive-type photoresist compositions are used for forming, for example, plated articles such as bumps and metal posts by a plating process. Specifically, a photoresist layer having a desired film thickness is formed on a support such as a metal substrate with a chemically amplified photoresist composition, and the photoresist layer is exposed through a predetermined mask pattern and then developed to form a photoresist pattern used as a template in which portions for forming bumps and metal posts have been selectively removed (stripped). Then, bumps and metal posts can be formed by embedding a conductor such as copper into the removed portions (nonresist sections) by plating, and then removing the surrounding residual resist pattern.

Patent Document 1: Japanese Unexamined Patent Application, Publication No. H09-176112
Patent Document 2: Japanese Unexamined Patent Application, Publication No. H11-052562

SUMMARY OF THE INVENTION

When forming connection terminals such as bumps and metal posts by the above plating process, the width of the bottom (the side proximate to the surface of a support) is desirably wider than that of the top (the side proximate to the surface of a resist layer) in a nonresist section of a resist pattern serving as a template. The contact area between the bottom surfaces of the connecting terminals such as bumps or metal posts and the support is thereby increased, and the adhesiveness between the connecting terminals and the support is thereby improved.

However, in a case where a resist pattern serving as a template for forming a bump, a metal post and the like is formed on a metal substrate with a conventionally known chemically amplified positive-type photoresist composition as disclosed in Patent Documents 1 and 2 and the like, a phenomenon called "footing" tends to occur in which the width of the bottom becomes narrower than that of the top in a nonresist section due to a protruded resist section toward the nonresist section at the contacting surface between the substrate surface and the resist pattern. For this reason, in a case where a conventionally known chemically amplified positive-type photoresist composition as disclosed in Patent Documents 1 and 2 and the like is used, a resist pattern having a nonresist section in which the width of the bottom is wider than that of the top is difficult to be formed on a metal substrate.

Furthermore, when a resist pattern serving as a template for plating is formed on the metal substrate using the chemically amplified positive-type photoresist composition, it is also desired that the surface of the metal substrate is not susceptible to denaturation, and a development residue does not easily occur.

The present invention has been made in view of the above-mentioned problems. An object of the present invention is to provide a chemically amplified positive-type photosensitive resin composition capable of suppressing occurrence of "footing" in which the width of the bottom (the side proximate to the surface of a support) becomes narrower than that of the top (the side proximate to the surface of a resist layer) in a nonresist section, denaturation of the surface of the metal substrate, and occurrence of a development residue, when a resist pattern serving as a template for a plated article is formed on a metal surface of the substrate having the metal surface by using the chemically amplified positive-type photosensitive resin composition. Another object of the present invention is to provide a method for manufacturing a substrate with a template using the photosensitive resin composition. Still another object of the present invention is to provide a method for manufacturing a plated article using the substrate with the template.

After conducting extensive studies in order to achieve the above objects, the present inventors find that the above problem can be solved by including a mercapto compound with a specific structure in a chemically amplified positive-type photosensitive resin composition. Then, the present inventors have completed the present invention. Specifically, the present invention provides the following.

A first aspect of the present invention is a chemically amplified positive-type photosensitive resin composition including: an (A) acid generator that produces an acid when irradiated with an active ray or radiation, a (B) resin whose solubility in alkali increases under an action of acid, and a (C) mercapto compound represented by the following formula (1):

$$\text{HS—Y—(R)}_u \quad (1)$$

(in the formula, R represents an acid decomposition group whose solubility in alkali increases under the action of acid; Y represents a linking group having a valency of u+1; and u represents an integer of 1 to 3).

A second aspect of the present invention is a method for manufacturing a substrate with a template, the method including:
forming a photosensitive resin layer on a metal surface of a substrate having the metal surface, the photosensitive resin layer comprising the chemically amplified positive-type photosensitive resin composition according to the first aspect;
irradiating the photosensitive resin layer with an active ray or radiation to perform exposure; and developing the photosensitive resin layer after the exposure to create a template for forming a plated article.

A third aspect of the present invention is a method for manufacturing a plated article, the method including: plating the substrate with a template manufactured by the method according to the second aspect to form the plated article within the template.

The present invention can provide a chemically amplified positive-type photosensitive resin composition capable of suppressing occurrence of footing in which the width of the bottom (the side proximate to the surface of a support) becomes narrower than that of the top (the side proximate to the surface of a resist layer) in a nonresist section, denaturation of the surface of the metal substrate, and occurrence of a development residue, when a resist pattern serving as a template for a plated article is formed on a metal surface of the substrate having the metal surface by using the chemically amplified positive-type photosensitive resin composition; a method for manufacturing a substrate with a template by using the photosensitive resin composition; and a method for manufacturing a plated article using the substrate with the template.

BRIEF DESCRIPTION OF THE DRAWINGS

FIG. 1 shows schematically illustrated cross-sections of resist patterns observed when measuring the amount of footing at nonresist sections in the resist patterns in Examples and Comparative Examples.

DETAILED DESCRIPTION OF THE INVENTION

Chemically Amplified Positive-Type Photosensitive Resin Composition

The chemically amplified positive-type photosensitive resin composition (hereinafter also referred to as the photosensitive resin composition) contains the (A) acid generator capable of producing an acid when irradiated with an active ray or radiation (hereinafter also referred to as the (A) acid generator), the (B) resin whose solubility in alkali increases under the action of acid (hereinafter also referred to as the (B) resin) and (C) the mercapto compound with a predetermined structure. The photosensitive resin composition may comprise a component such as a (D) alkali soluble resin, an (E) acid diffusion suppressing agent and an (S) organic solvent, if desired.

There is no particular limitation for the film thickness of a resist pattern formed with the photosensitive resin composition. The photosensitive resin composition is preferably used for forming a thick resist pattern. The film thickness of a resist pattern formed with the photosensitive resin composition is preferably 10 μm or more, more preferably 10 to 150 μm, in particular preferably 20 to 120 μm, and in particular preferably 20 to 80 μm.

Below, described are essential or optional components in the photosensitive resin composition, and a method of manufacturing the photosensitive resin composition.

<(A) Acid Generator>

The (A) acid generator is a compound capable of producing an acid when irradiated with an active ray or radiation, and is not particularly limited as long as it is a compound which directly or indirectly produces an acid under the action of light. The (A) acid generator is preferably any one of the acid generators of the first to fifth aspects that will be described below. Hereinafter, suitable examples among the (A) acid generators that are suitably used in photosensitive resin compositions will be described as the first to fifth aspects.

The first aspect of the (A) acid generator may be a compound represented by the following formula (a1).

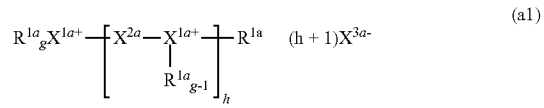

$$R^{1a}_g X^{1a+} -\!\!\left[\!X^{2a} -\!X^{1a+}\!\atop R^{1a}_{g-1}\!\right]_h\!\!- R^{1a} \quad (h+1)X^{3a-} \quad (a1)$$

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$. $R^{2a}$ represents an alkyl group having 1 to 5 carbon atoms, or an aryl group having 6 to 10 carbon atoms.

$X^{2a}$ represents a structure represented by the following formula (a2).

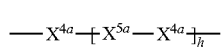 (a2)

In the formula (a2), $X^{4a}$ represents an alkylene group having 1 to 8 carbon atoms, an arylene group having 6 to 20 carbon atoms, or a divalent group of a heterocyclic compound having 8 to 20 carbon atoms, and $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

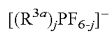 (a17)

In the formula (a17), $R^{3a}$ represents an alkyl group having 80% or more of the hydrogen atoms substituted by fluorine atoms. j represents the number of $R^{3a}$s and is an integer from 1 to 5. $R^{3a}$s in the number of j may be respectively identical to or different from each other.

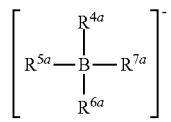 (a18)

In the formula (a18) $R^{4a}$ to $R^{7a}$ each independently represents a fluorine atom or a phenyl group, and a part or all of the hydrogen atoms of the phenyl group may be substituted by at least one selected from the group consisting of a fluorine atom and a trifluoromethyl group.

Examples of the onium ion in the compound represented by the formula (a1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio]phenyl}sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, isopropylphenyl(p-tolyl)iodonium, and 4-isobutylphenyl(p-tolyl)iodonium.

Among the onium ions in the compound represented by the formula (a1), a preferred onium ion may be a sulfonium ion represented by the following formula (a19).

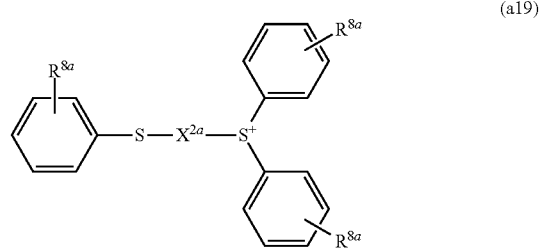

In the formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the formula (a1).

Specific examples of the sulfonium ion represented by the formula (a19) include 4-(phenylthio)phenyldiphenylsulfonium, 4-(4-benzoyl-2-chlorophenylthio)phenylbis(4-fluorophenyl) sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, and diphenyl[4-(p-terphenylthio)phenyl]diphenylsulfonium.

In regard to the fluorinated alkylfluorophosphoric acid anion represented by the formula (a17), $R^{3a}$ represents an alkyl group substituted with a fluorine atom, and a preferred number of carbon atoms is 1 to 8, while a more preferred number of carbon atoms is 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted by fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the formula (a1) decreases.

A particularly preferred example of $R^{3a}$ is a linear or branched perfluoroalkyl group having 1 to 4 carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)$ CF, and $(CF_3)_3C$. j which is the number of $R^{3a}$s represents an integer from 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2$ CFCF$_2$)$_2$PF$_4$]$^-$, [((CF$_3$)$_2$CFCF$_2$)$_3$PF$_3$]$^-$, [(CF$_3$CF$_2$CF$_2$CF$_2$)$_2$ PF$_4$]$^-$, and [(CF$_3$CF$_2$CF$_2$)$_3$PF$_3$]$^-$.

Among these, [(CF$_3$CF$_2$)$_3$PF$_3$]$^-$, [(CF$_3$CF$_2$CF$_2$)$_3$PF$_3$]$^-$, [((CF$_3$)$_2$CF)$_3$PF$_3$]$^-$, [((CF$_3$)$_2$CF)$_2$PF$_4$]$^-$, [((CF$_3$)$_2$CFCF$_2$)$_3$ PF$_3$]$^-$, and [((CF$_3$)$_2$CFCF$_2$)$_2$PF$_4$]$^-$, are particularly preferred.

Preferred specific examples of the borate anion represented by the formula (a18) include tetrakis(pentafluorophenyl)borate ([B(C$_6$F$_5$)$_4$]$^-$) tetrakis[(trifluoromethyl)phenyl] borate ([B(C$_6$H$_4$CF$_3$)$_4$]$^-$), difluorobis(pentafluorophenyl) borate ([(C$_6$F$_5$)$_2$BF$_2$]$^-$), trifluoro(pentafluorophenyl)borate ([(C$_6$F$_5$)BF$_3$]$^-$), and tetrakis(difluorophenyl)borate ([B(C$_6$H$_3$F$_2$)$_4$]$^-$). Among these, tetrakis(pentafluorophenyl)borate ([B(C$_6$F$_5$)$_4$]$^-$) is particularly preferred.

The second aspect of the (A) acid generator include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl) ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl) ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl) ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl) ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

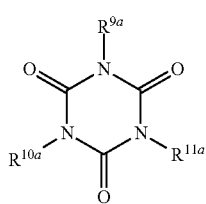

(a3)

In the formula (a3), R$^{9a}$, R$^{10a}$ and R$^{11a}$ each independently represent a halogenated alkyl group.

Further, the third aspect of the (A) acid generator include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

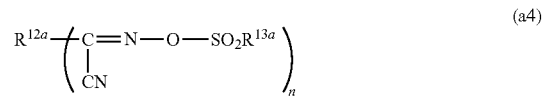

(a4)

In the formula (a4), R$^{12a}$ represents a monovalent, bivalent or trivalent organic group, R$^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that R$^{13a}$ is an alkyl group having 1 to 6 carbon atoms such as a methyl group, an ethyl group, a propyl group, and a butyl group. In particular, compounds in which R$^{12a}$ represents an aromatic compound group, and R$^{13a}$ represents an alkyl group having 1 to 4 carbon atoms are preferred.

Examples of the acid generator represented by the formula (a4), include compounds in which R$^{12a}$ is any one of a phenyl group, a methylphenyl group and a methoxyphenyl group, and R$^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the formula (a4) is specifically an acid generator represented by the following formulae.

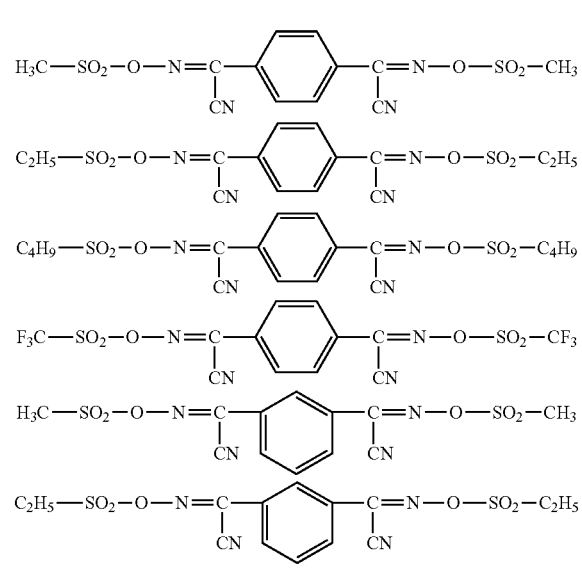

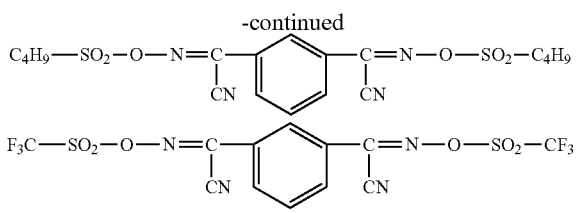

In addition, the fourth aspect of the (A) acid generator include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, a linear or branched alkoxy group having 1 to 6 carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 to 3.

Preferably, the cation moiety of the onium salt having a naphthalene ring at the cation moiety is of the structure represented by the following formula (a5).

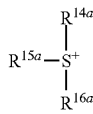

(a5)

In the formula (a5), at least one of $R^{14a}$, $R^{15a}$ and $R^{16a}$ represents a group represented by the following formula (a6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$ and $R^{16a}$ is a group represented by the following formula (a6), and the remaining two are each independently a linear or branched alkylene group having 1 to 6 carbon atoms, and these terminals may bond to form a ring structure.

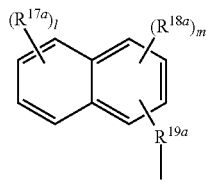

(a6)

In the formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms, and $R^{19a}$ represents a single bond or a linear or branched alkylene group having 1 to 6 carbon atoms that may have a substituent. l and m each independently represent an integer of 0 to 2, and l+m is no greater than 3. In this regard, when there exists a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the formula (a6) is one in view of the stability of the compound, and the remaining are linear or branched alkylene groups having 1 to 6 carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 to 6 carbon atoms, linear or branched alkyl groups having 1 to 6 carbon atoms, or the like.

Examples of suitable cation moiety include those represented by the following formulae (a7) and (a8), and the structure represented by the following formula (a8) is particularly preferable.

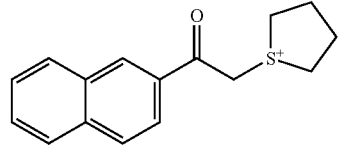

(a7)

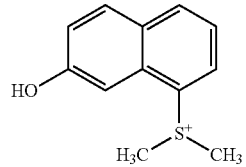

(a8)

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 to 20 carbon atoms. Preferably, the carbon number is 1 to 10 in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 to 20 carbon atoms, and is exemplified by a phenol group or a naphthyl group that may be unsubstituted or substituted with an alkyl group or a halogen atom. In particular, aryl groups having 6 to 10 carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

In the formula (a9), $R^{20a}$ represents a group represented by the following formula (a10) or (a11), or a group represented by the following formula (a12).

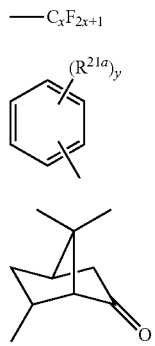

In the formula (a10), x represents an integer of 1 to 4. Also, in the formula (a11), $R^{21a}$ represents a hydrogen atom, a hydroxyl group, a linear or branched alkyl group having 1 to 6 carbon atoms, or a linear or branched alkoxy group having 1 to 6 carbon atoms, and y represents an integer of 1 to 3. Of these, trifluoromethane sulfonate, and perfluorobutane sulfonate are preferable in view of safety.

In addition, a nitrogen-containing moiety represented by the following formula (a13) or (a14) may be also be used for the anion moiety.

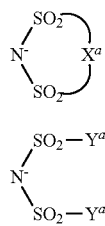

In the formulae (a13) and (a14), $X^a$ represents a linear or branched alkylene group of which at least one hydrogen atom is substituted with a fluorine atom, the carbon number of the alkylene group is 2 to 6, preferably 3 to 5, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 to 10, preferably 1 to 7, and more preferably 1 to 3.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted by a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70 to 100% and more preferably 90 to 100%, and most preferable are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) and (a16).

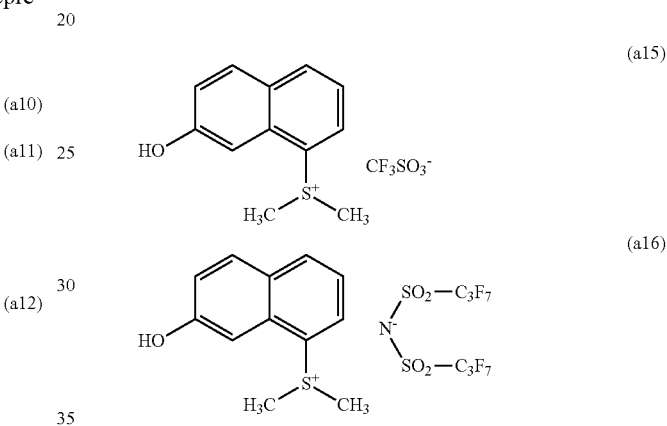

Also, the fifth aspect of the (A)acid generator include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl) diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This (A) acid generator may be used alone, or two or more kinds may be used in combination. Furthermore, the content of the (A) acid generator (A) is preferably adjusted to 0.1% to 10% by mass, and more preferably 0.5% to 3% by mass, relative to the total mass of the photosensitive resin composition. When the amount of the acid generator (A) used is adjusted to the range described above, a photosensitive resin composition that is a uniform solution having satisfactory sensitivity and exhibiting excellent storage stability can be readily prepared.

<(B) Resin>

The (B) resin whose alkali solubility increases by the action of an acid is not particularly limited, and an arbitrary resin whose alkali solubility increases by the action of an acid may be used. Of these, at least one resin selected from the group consisting of (B1) novolak resin, (B2) polyhydroxystyrene resins and (B3) acrylic resin is preferably contained.

[(B1) Novolak Resin]

As the (B1) novolak resin, a resin including the structural unit represented by the following formula (b1) may be used.

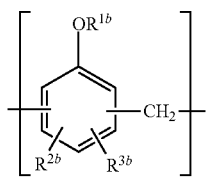
(b1)

In the formula (b1), $R^{1b}$ represents an acid-dissociable dissolution-inhibiting group, and $R^{2b}$ and $R^{3b}$ each independently represent a hydrogen atom or an alkyl group having 1 to 6 carbon atoms.

The acid-dissociable dissolution-inhibiting group represented by the above $R^{1b}$ is preferably a group represented by the following formula (b2) or (b3), a linear, branched or cyclic alkyl group having 1 to 6 carbon atoms, a vinyloxyethyl group, a tetrahydropyranyl group, a tetrafuranyl group, or a trialkylsilyl group.

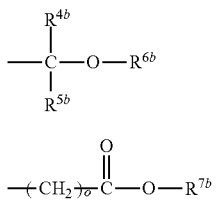
(b2)

(b3)

In the formulae (b2) and (b3), $R^{4b}$ and $R^{5b}$ each independently represent a hydrogen atom, or a linear or branched alkyl group having 1 to 6 carbon atoms, $R^{6b}$ represents a linear, branched or cyclic alkyl group having 1 to 10 carbon atoms, $R^{7b}$ represents a linear, branched or cyclic alkyl group having 1 to 6 carbon atoms, and o represents 0 or 1.

Examples of the linear or branched alkyl group include a methyl group, an ethyl group, a propyl group, an isopropyl group, a n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociable dissolution-inhibiting group represented by the formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociable dissolution-inhibiting group represented by the formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

[(B2) Polyhydroxystyrene Resin]

As the (B2) polyhydroxystyrene resin, a resin including the structural unit represented by the following formula (b4) may be used.

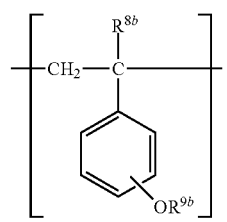
(b4)

In the formula (b4), $R^{8b}$ represents a hydrogen atom or an alkyl group having 1 to 6 carbon atoms, and $R^{9b}$ represents an acid-dissociable dissolution-inhibiting group.

The alkyl group having 1 to 6 carbon atoms may include, for example, linear, branched or cyclic alkyl groups having 1 to 6 carbon atoms. Examples of the linear or branched alkyl group include a methyl group, ethyl group, propyl group, isopropyl group, n-butyl group, isobutyl group, tert-butyl group, pentyl group, isopentyl group and neopentyl group, and examples of the cyclic alkyl group include a cyclopentyl group and cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the (B2) polyhydroxystyrene resin may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[(B3) Acrylic Resin]

As the (B3) acrylic resin, a resin including a structural unit represented by the following formulae (b5) to (b7) may be used.

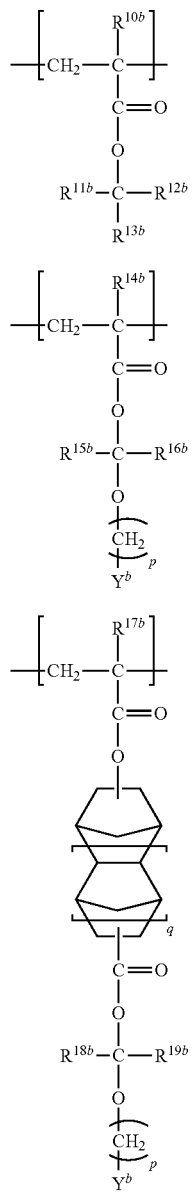

$R^{10b}$ and $R^{14b}$ to $R^{19b}$ in the above formulae (b5) to (b7) are each independently a hydrogen atom, a linear or branched alkyl group having 1 to 6 carbon atoms, a fluorine atom or a linear or branched fluorinated alkyl group having 1 to 6 carbon atoms. $R^{11b}$ to $R^{13b}$ are each independently a linear or branched alkyl group having 1 to 6 carbon atoms, a linear or branched fluorinated alkyl group having 1 to 6 carbon atoms or an aliphatic cyclic group having 5 to 20 carbon atoms. $R^{12b}$ and $R^{13b}$ may join each other to form a hydrocarbon ring having 5 to 20 carbon atoms together with a carbon atom to which the both are attached. $Y^b$ represents an aliphatic cyclic group or an alkyl group optionally having a substituent. p is an integer of 0 to 4, and q is 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms. Specific examples of the aliphatic cyclic group include a group in which one or more hydrogen atoms are removed from monocycloalkanes and polycycloalkanes such as bicycloalkanes, tricycloalkanes and tetracycloalkanes. Specific examples thereof include a group in which one hydrogen atom is removed from monocycloalkanes such as cyclopentane, cyclohexane, cycloheptane and cyclooctane, and polycycloalkanes such as adamantane, norbornane, isobornane, tricyclodecane and tetracyclododecane. In particular, cyclohexane and adamantane from which one hydrogen atom is removed (optionally further having a substituent) are preferable.

In a case where the above $R^{12b}$ and $R^{13b}$ do not form hydrocarbon ring by joining each other, a linear or branched alkyl group having 2 to 4 carbon atoms is preferred as the above $R^{11b}$, $R^{12b}$ and $R^{13b}$ in view of high contrast, good resolution, good focal depth-width and the like. As the above $R^{15b}$, $R^{16b}$, $R^{18b}$ and $R^{19b}$, preferred is a hydrogen atom or a methyl group.

The above $R^{12b}$ and $R^{13b}$ may form an aliphatic cyclic group having 5 to 20 carbon atoms together with a carbon atom to which the both are attached. Specific examples of such an aliphatic cyclic group include a group in which one or more hydrogen atoms are removed from monocycloalkane; and polycycloalkane such as bicycloalkane, tricycloalkane and tetracycloalkane. Specifically, they include a group in which one or more hydrogen atoms are removed from monocycloalkane such as cyclopentane, cyclohexane and cycloheptane; and polycycloalkane such as adamantane, norbornane, isobornane, tricyclodecane and tetracyclododecane; and the like. In particular, preferred is a group (optionally further having a substituent) in which one or more hydrogen atoms are removed from cyclohexane and adamantane.

Further, in a case where an aliphatic cyclic group to be formed with the above $R^{12b}$ and $R^{13b}$ has a substituent on the ring backbone thereof, examples of the above substituent include a polar group such as a hydroxy group, a carboxyl group, a cyano group and an oxygen atom (═O), and a linear or branched alkyl group having 1 to 4 carbon atoms. As the polar group, an oxygen atom (═O) is particularly preferred.

The aforementioned $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $Y^b$ has a substituent on the ring skeleton, the substituent is exemplified by polar groups such as a hydroxide group, carboxyl group, cyano group and oxygen atom (═O), and linear or branched lower alkyl groups having 1 to 4 carbon atoms. The polar group is preferably an oxygen atom (═O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-iso-propoxyethyl group, 1-n-butoxyethyl group, 1-isobutoxy-ethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

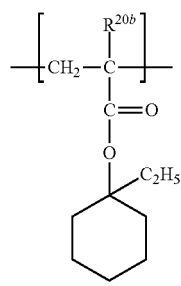
(b5-1)

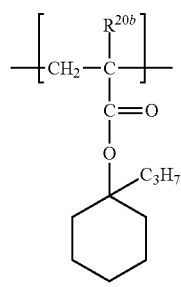
(b5-2)

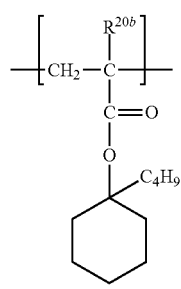
(b5-3)

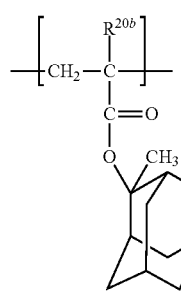
(b5-4)

-continued

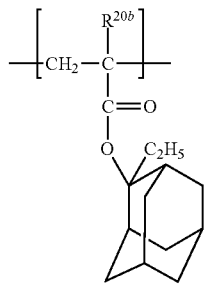
(b5-5)

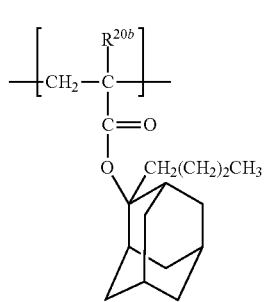
(b5-6)

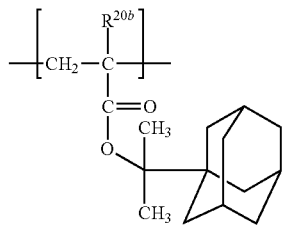
(b5-7)

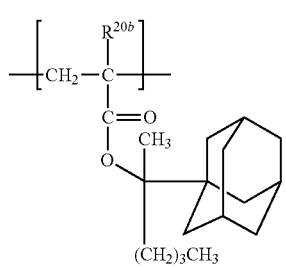
(b5-8)

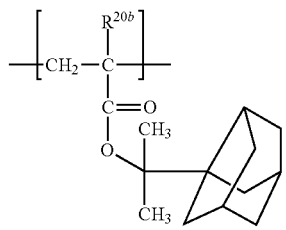
(b5-9)

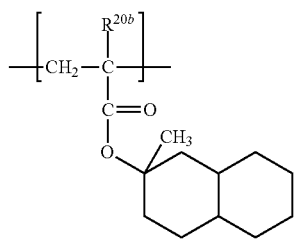
(b5-10)

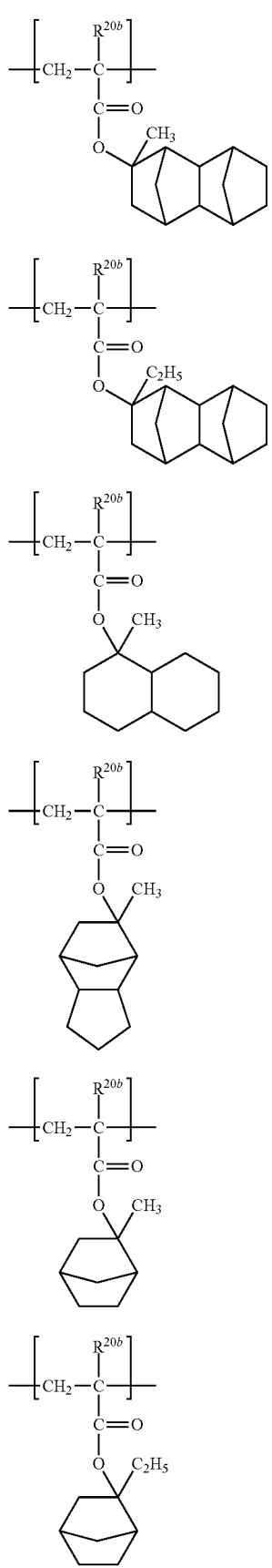
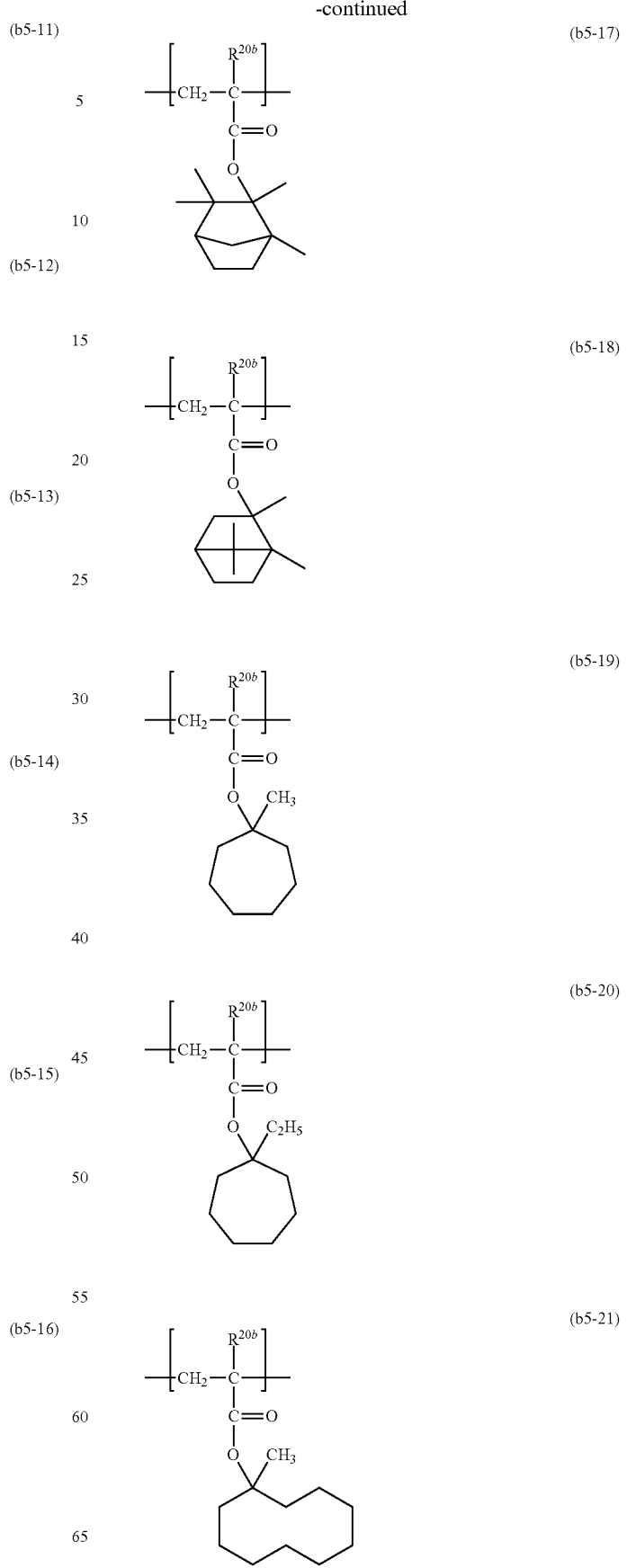

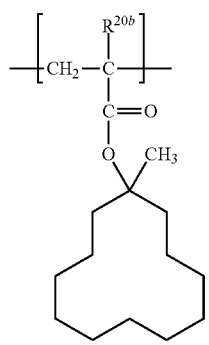 (b5-22)
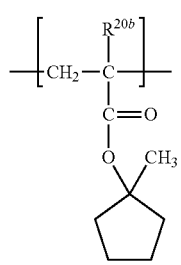 (b5-23)
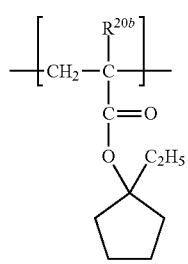 (b5-24)
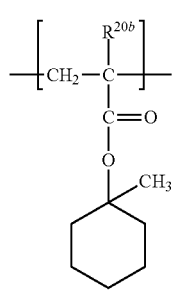 (b5-25)
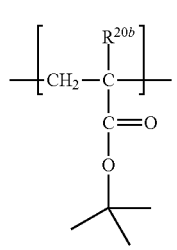 (b5-26)

(b5-32)
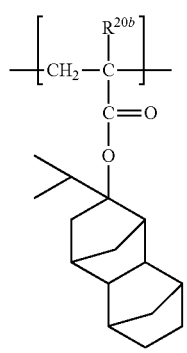
(b5-33)
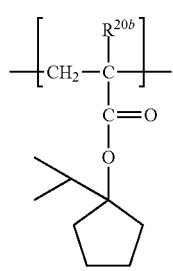
In the above formulae (b5-1) to (b5-33), $R^{20b}$ represents a hydrogen atom or a methyl group.
Preferable specific examples of the structural unit represented by the above formula (b6) include those represented by the following formulae (b6-1) to (b6-26).
(b6-1)
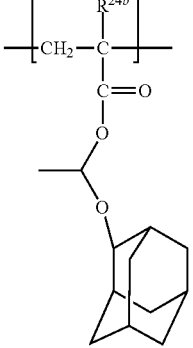
(b6-2)
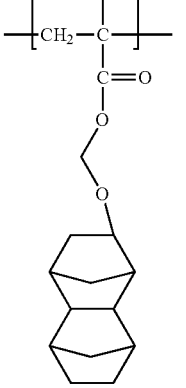
(b6-3)
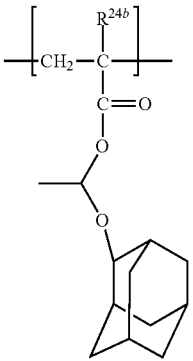
(b6-4)
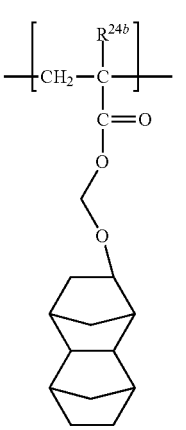
(b6-5)
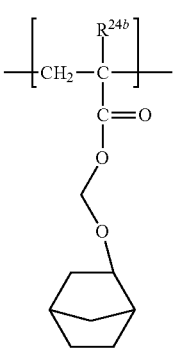
(b6-6)
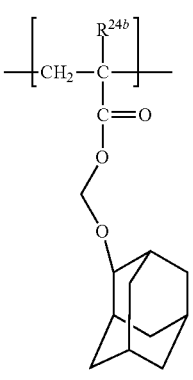

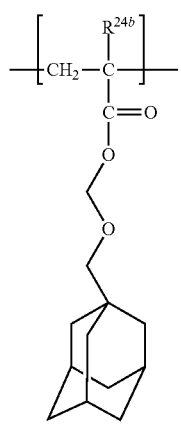 (b6-7)
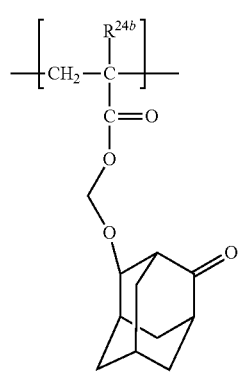 (b6-8)
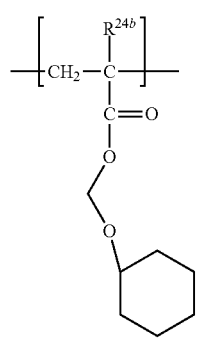 (b6-9)
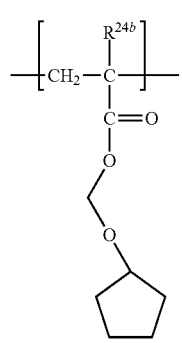 (b6-10)
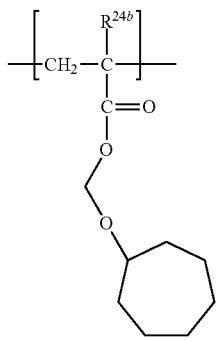 (b6-11)
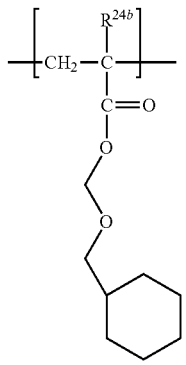 (b6-12)
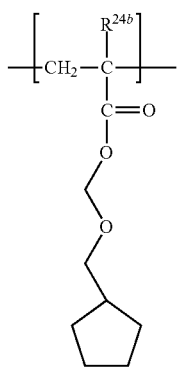 (b6-13)
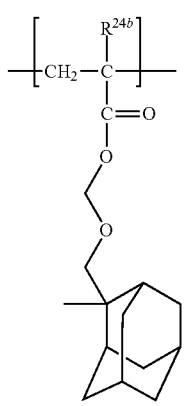 (b6-14)

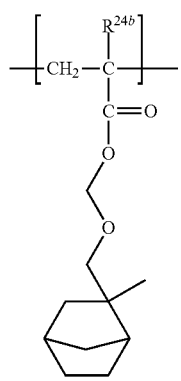
(b6-15)
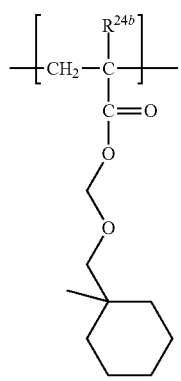
(b6-16)
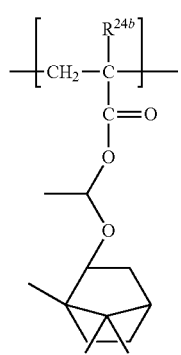
(b6-17)
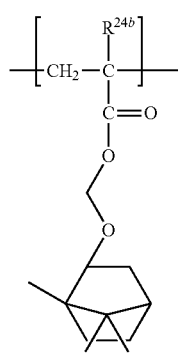
(b6-18)
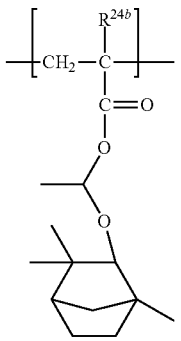
(b6-19)
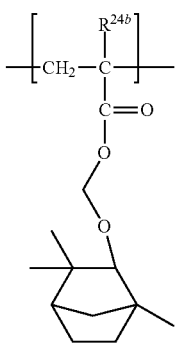
(b6-20)
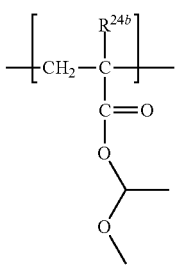
(b6-21)
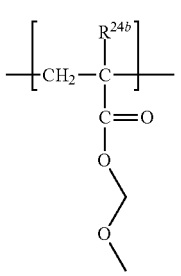
(b6-22)
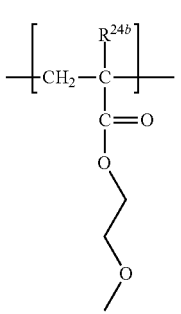
(b6-23)

(b6-24)
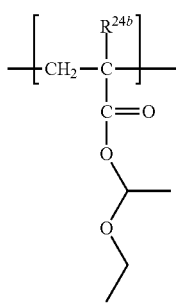
(b6-25)
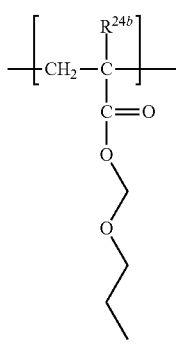
(b6-26)
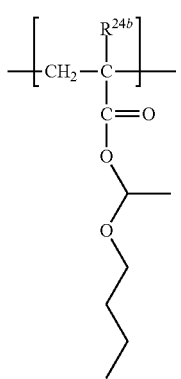
In the above formulae (b6-1) to (b6-26), $R^{20b}$ presents a hydrogen atom or a methyl group.
Preferable specific examples of the structural unit represented by the above formula (b7) include those represented by the following formulae (b7-1) to (b7-15).
(b7-1)
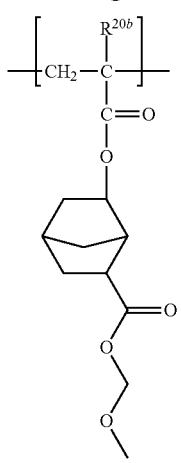
(b7-2)
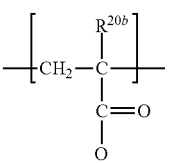
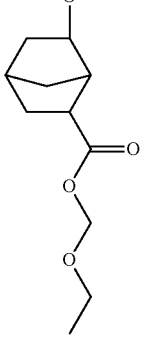
(b7-3)
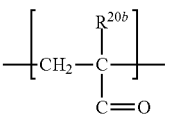
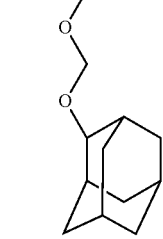
(b7-4)
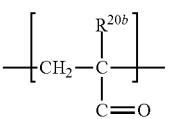
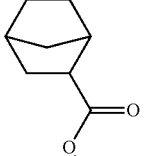
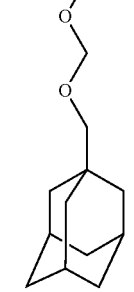

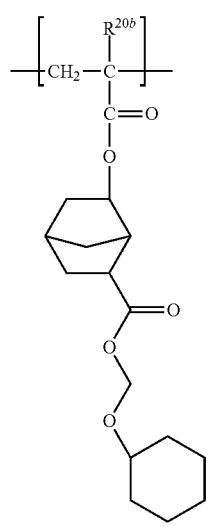
(b7-5)
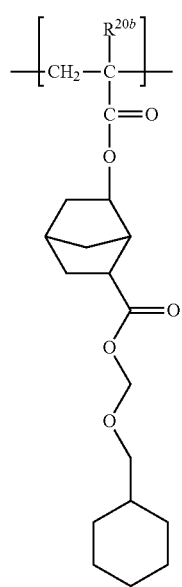
(b7-6)
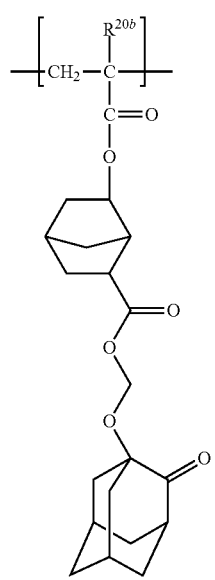
(b7-7)
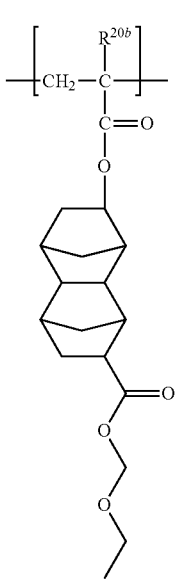
(b7-8)
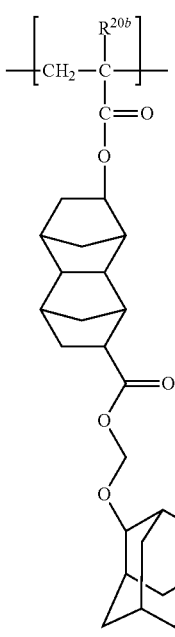
(b7-9)

(b7-10)
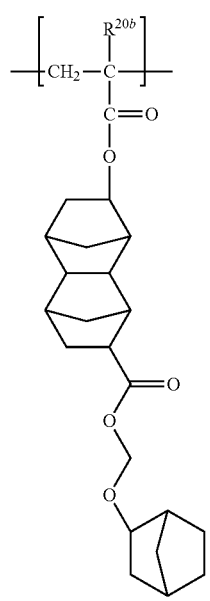
(b7-12)
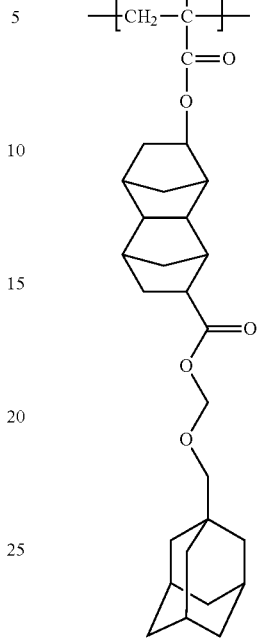
(b7-11)
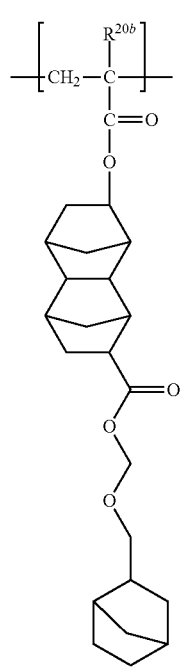
(b7-13)
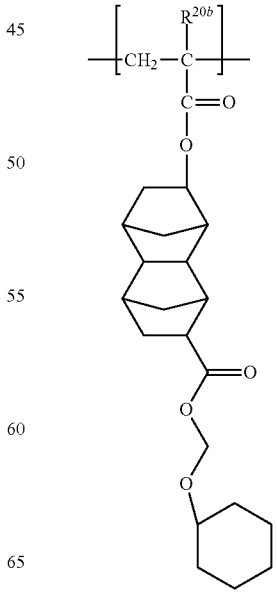

-continued

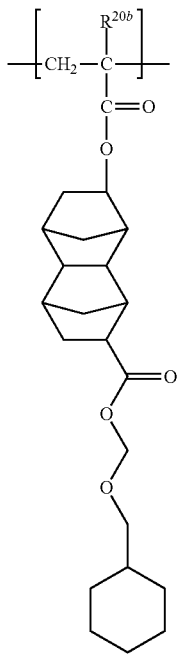

(b7-14)

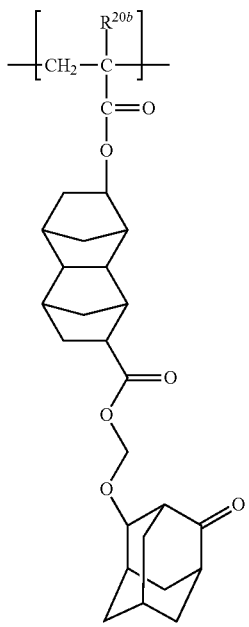

(b7-15)

In the above formula (b7-1) to (b7-15), $R^{20b}$ resents a hydrogen atom or a methyl group.

It is also preferred that the (B3) acrylic resin includes a copolymer containing a structural unit derived from a polymerizable compound having an ether bond in addition to the structural unit represented by the above formulae (b5) to (b7).

Illustrative examples of the polymerizable compound having an ether linkage include radical polymerizable compounds such as (meth)acrylic acid derivatives having an ether linkage and an ester linkage, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the polymerizable compound having an ether linkage is preferably, 2-methoxyethyl (meth)acrylate, 2-ethoxyethyl (meth)acrylate, or methoxytriethylene glycol (meth)acrylate. These polymerizable compounds may be used alone, or in combinations of two or more thereof.

Furthermore, the (B3) acrylic resin may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl (meth)acrylate, butyl(meth)acrylate and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Furthermore, examples of the polymerizable compound include (meth)acrylic acid esters having a non-acid-dissociable aliphatic polycyclic group, and vinyl group-containing aromatic compounds. As the non-acid-dissociable aliphatic polycyclic group, particularly, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 to 5 carbon atoms as a substituent.

Specific examples of the (meth)acrylic acid esters having a non-acid-dissociable aliphatic polycyclic group include compounds having structures represented by the following formulae (b8-1) to (b8-5).

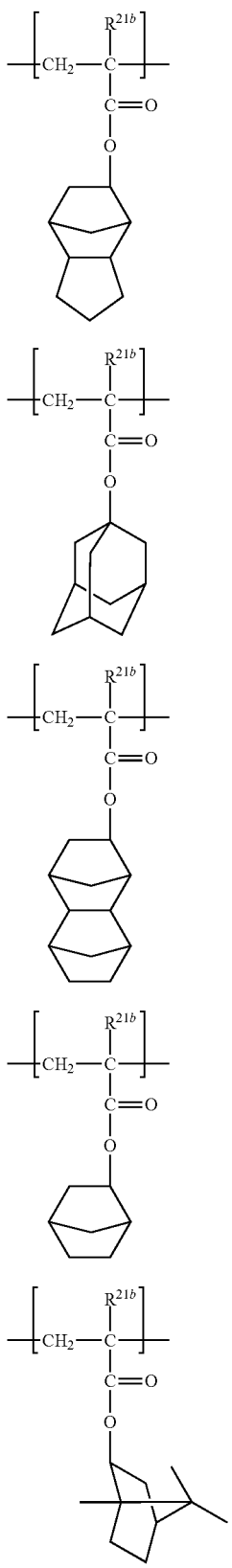

(b8-1)

(b8-2)

(b8-3)

(b8-4)

(b8-5)

In formulae (b8-1) to (b8-5) $R^{21b}$ represents a hydrogen atom or a methyl group.

Among the (B) resins, the (B3) acrylic resins are preferably used. Among such (B3) acrylic resins, a copolymer having a constituent unit represented by formula (b5), a constituent unit derived from (meth)acrylic acid, a constituent unit derived from a (meth)acrylic acid alkyl ester, and a constituent unit derived from a (meth)acrylic acid aryl ester is preferred.

Such a copolymer is preferably a copolymer represented by the following formula (b9).

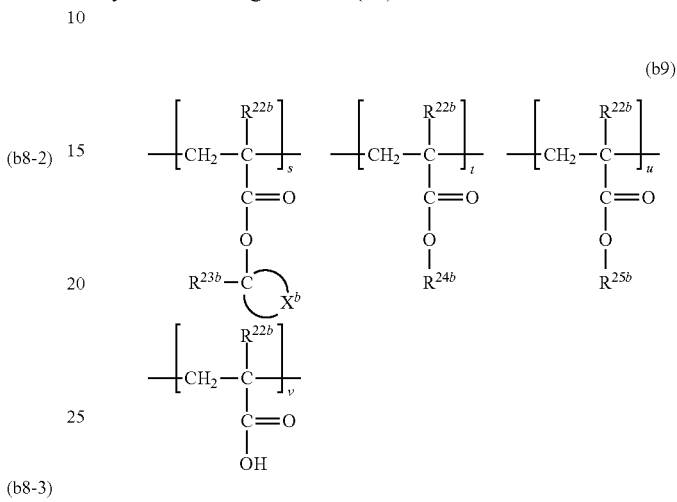

(b9)

In the formula (b9), $R^{22b}$ represents a hydrogen atom or a methyl group; $R^{23b}$ represents a linear or a branched alkyl group having 2 to 4 carbon atoms; $X^b$ represents a hydrocarbon ring having 5 to 20 carbon atoms formed together with a carbon atom to which it is attached; $R^{24b}$ represents a linear or branched alkyl group having 1 to 6 carbon atoms or an alkoxyalkyl group having 1 to 6 carbon atoms; and $R^{25b}$ represents an aryl group having 6 to 12 carbon atoms.

In regard to the copolymers represented by the above formula (b9), s, t, u and v represent each molar ratio of the structural unit, with s being 8 to 45% by mole, t being 10 to 65% by mole, u being 3 to 25% by mole, and v being 6 to 25% by mole.

The polystyrene equivalent mass average molecular weight of the (B) resin is preferably 10,000 to 600,000, more preferably 20,000 to 400,000, and still more preferably 30,000 to 300,000. By thus adjusting the mass average molecular weight, the photosensitive resin layer can maintain sufficient strength without deteriorating peel properties with supports, and also swelling of profiles in plating, and generation of cracks can be prevented.

It is also preferred that the resin (B) has a dispersivity of no less than 1.05. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the (B) resin (B) is preferably 5 to 60% by mass with respect to the total mass of the photosensitive rein composition according to the present invention.

<(C) Mercapto Compound>

The photosensitive resin composition contains the (C) mercapto compound represented by the following formula (1).

HR—Y—(R)            (1)

(in the formula, R represents an acid decomposition group whose solubility in alkali increases under the action of acid;

Y represents a linking group having a valency of u+1; and u represents an integer of 1 to 3).

In a case where a resist pattern used as a template for plating is formed with a positive-type photosensitive resin composition, the width of a bottom (the side proximate to the surface of a substrate) may be narrower than that of the top (the side proximate to the surface of a resist layer) at a nonresist section of the resist pattern. In a case where a plated article is manufactured using a resist pattern having a nonresist section of such a shape as a template, the adhesive state of the plated article to the substrate tends to be unstable since the contact surface between the plated article and the substrate is small. In contrast, in a case where a photosensitive resin composition contains the (C) mercapto compound represented by the following formula (1), the phenomenon can be controlled that the width of the bottom is narrower than that of the top at a nonresist section of the resist pattern.

Furthermore, when a resist pattern is formed on a metal substrate using a photosensitive resin composition containing a (C) mercapto compound represented by the formula (1), the surface of the metal substrate is less susceptible to denaturation, and residues after development does not easily occur.

In the formula (1), Y represents a linking group having a valency of u+1, and usually, an organic group having a valency of u+1. The organic group may be an aliphatic group, or may be an aromatic group, or a group including a combination of the aliphatic group and the aromatic group. The aliphatic group included in Y may have a linear or branched structure, or a cyclic structure, or a structure having a combination of these structures. The aliphatic group included in Y may include an unsaturated bond. The aromatic group included in Y may be an aromatic hydrocarbon group, or an aromatic heterocycle group.

When Y is an organic group, the organic group may include a heteroatom such as N, O, S, P, and halogen atoms.

When Y is an organic group, the number of carbon atoms of the organic group is not particularly limited within a range where the objects of the present invention are not impaired. When Y is an organic group, the number of carbon atoms of the organic group is preferably 1 to 30, more preferably 1 to 20, and particularly preferably 1 to 10.

When Y includes an aliphatic hydrocarbon group, the aliphatic hydrocarbon group may have a substituent. Preferable examples of the substituent include a halogen atom, a nitro group, a cyano group, an alkoxy group, a phenoxy group, naphthoxy group, an alkylthio group, a phenylthio group, a naphthylthio group, an aliphatic acyl group, a benzoyl group, a naphthoyl group, an aliphatic acyloxy group, a benzoyloxy group, a naphthoyloxy group, an alkoxycarbonyl group, a phenoxy carbonyl group, a naphthoxy carbonyl group, an amino group, an alkyl amino group, a dialkyl amino group, a phenyl amino group, a diphenyl amino group, a carbamoyl group, an alkyl carbamoyl group, and a phenyl carbamoyl group. The number of substituents that may be possessed by the aliphatic hydrocarbon group is not particularly limited.

When Y includes an aromatic hydrocarbon group, an aliphatic heterocycle group, or an aromatic heterocycle group, these groups may have a substituent. Preferable examples of the substituent include an alkyl group, a halogen atom, a nitro group, a cyano group, an alkoxy group, a phenoxy group, naphthoxy group, an alkylthio group, a phenylthio group, a naphthylthio group, an aliphatic acyl group, a benzoyl group, a naphthoyl group, an aliphatic acyloxy group, a benzoyloxy group, a naphthoyloxy group, an alkoxycarbonyl group, a phenoxy carbonyl group, a naphthoxy carbonyl group, an amino group, an alkyl amino group, a dialkyl amino group, a phenyl amino group, a diphenyl amino group, a carbamoyl group, an alkyl carbamoyl group, and a phenyl carbamoyl group. The number of substituents that may be possessed by the aromatic hydrocarbon group, the aliphatic heterocycle group, or the aromatic heterocycle group is not particularly limited.

Y is preferably an aliphatic hydrocarbon group, a group in which two or more aliphatic hydrocarbon groups are bonded together via an ether bond or an ester bond, a group including an aromatic hydrocarbon group, an aromatic heterocyclic group, or an aliphatic heterocyclic group.

When Y is an aliphatic hydrocarbon group, preferable examples of the aliphatic hydrocarbon group preferably include groups in which u+1 hydrogen atoms bonded to a carbon atom are removed from the following aliphatic hydrocarbon compounds. Specific examples of the aliphatic hydrocarbon to impart the aliphatic hydrocarbon group include methane, ethane, propane, butane, 2-methyl propane, pentane, hexane, cyclopropane, cyclobutane, cyclopentane, cyclohexane, cycloheptane, cyclooctane, cyclodecane, bicyclo[2.1.1]hexane, bicyclo[2.2.1]heptane, bicyclo[3.2.1]octane, bicyclo[2.2.2]octane, and adamantane.

Preferable examples of the group in which two or more aliphatic hydrocarbon groups are bonded together via an ether bond or an ester bond preferably include groups in which u+1 hydrogen atoms bonded to a carbon atom are removed from the following aliphatic compounds. The aliphatic compounds to impart a preferable group as the group in which two or more aliphatic hydrocarbon groups are bonded together via an ether bond or an ester bond include compounds represented by $Y^1$—O—$Y^2$, $Y^1$—O—$Y^3$—O—$Y^2$, $Y^1$—O—CO—$Y^2$, $Y^1$—O—CO—$Y^3$—O—CO—$Y^2$, $Y^1$—O—CO—$Y^3$—CO—O—$Y^2$, $Y^1$—CO—O—$Y^3$—O—CO—$Y^2$, $Y^1$—O—$Y^3$—O—CO—$Y^2$, and $Y^1$—O—$Y^3$—CO—O—$Y^2$, $Y^1$ and $Y^2$ are monovalent aliphatic hydrocarbon groups. $Y^3$ is a monovalent aliphatic hydrocarbon group.

$Y^1$ and $Y^2$ are preferably a group in which one hydrogen atom is removed from methane, ethane, propane, butane, 2-methyl propane, pentane, hexane, cyclopropane, cyclobutane, cyclopentane, cyclohexane, cycloheptane, cyclooctane, cyclodecane, bicyclo[2.1.1]hexane, bicyclo[2.2.1]heptane, bicyclo[3.2.1]octane, bicyclo[2.2.2]octane, or adamantane.

$Y^3$ is preferably a group in which two hydrogen atoms are removed from methane, ethane, propane, butane, 2-methyl propane, pentane, hexane, cyclopropane, cyclobutane, cyclopentane, cyclohexane, cycloheptane, cyclooctane, cyclodecane, bicyclo[2.1.1]hexane, bicyclo[2.2.1]heptane, bicyclo[3.2.1]octane, bicyclo[2.2.2]octane, or adamantane.

When Y is an aromatic hydrocarbon group, preferable examples of the group including an aromatic hydrocarbon group preferably include groups in which u+1 hydrogen atoms bonded to a carbon atom are removed from the following compounds. Specific examples of the compounds to impart the group including an aromatic hydrocarbon group preferably include benzene, toluene, o-xylene, m-xylene, p-xylene, ethyl benzene, o-methoxybenzene, m-methoxybenzene, p-methoxybenzene, o-ethoxybenzene, m-ethoxybenzene, p-ethoxybenzene, chlorobenzene, bromobenzene, naphthalene, biphenyl, diphenyl ether, diphenyl methane, diphenyl amine, benzoic acid phenyl, anthracene, and phenanthrene.

When Y is an aromatic heterocyclic group or an aliphatic heterocyclic group, preferable examples of the heterocyclic group preferably include a group in which u+1 hydrogen atoms bonded to a carbon atom are removed from the following heterocycles. Specific examples of the heterocycles to impart the preferable heterocyclic group include pyrrole, thiophene, furan, pyrane, thiopyrane, imidazole, pyrazole, thiazole, isothiazole, oxazole, isooxazole, pyridine, pyrazine, pyrimidine, pyridazine, pyrrolidine, pyrazolidine, imidazolidine, isoxazolidine, isothiazolidine, piperidine, piperazine, morpholine, thiomorpholine, chroman, thiochroman, isochroman, isothiochroman, indoline, isoindoline, pyrindine, indolizine, indole, indazole, purine, quinolizine, isoquinoline, quinoline, 1,5-naphthyridine, 1,6-naphthyridine, 1,7-naphthyridine, 1,8-naphthyridine, 2,6-naphthyridine, 2,7-naphthyridine, phthalazine (2,3-naphthyridine), quinoxaline (1,4-naphthyridine), quinazoline (1,3-naphthyridine), cinnoline (1,2-naphthyridine), pteridine, acridine, perimidine, phenanthroline, carbazole, carboline, phenazine, anthyridine, thiadiazole, oxadiazole, triazine, triazole, tetrazole, benzimidazole, benzoxazole, benzothiazole, benzothiadiazole, benzofuroxan, naphthoimidazole, benzotriazole, and tetraazaindene.

R is an acid decomposition group whose solubility in alkali increases under the action of acid. Since the mercapto compound represented by the formula (1) has a group R, an exposed section is solubilized in alkali in a coating film made of a photosensitive resin composition. Therefore, when a photosensitive resin composition including a mercapto compound represented by the formula (1) is used, a development residue does not easily occur. In this respect, a mercapto compound having a carboxy group is satisfactorily dissolved in an alkali developing solution, while it easily denatures the surface of the metal substrate due to baking after the photosensitive resin composition is applied. However, since the mercapto compound represented by the formula (1) has a group R, when a photosensitive resin composition including the mercapto compound represented by the formula (1) is used, a development residue does not easily occur although it is less likely to denature the surface of the metal substrate by the baking after the photosensitive resin composition is applied.

Preferable examples of R include a phenolic hydroxy group protected by an acid-dissociable dissolution-inhibiting group represented by —OR$^{1b}$ included in a unit represented by the above-mentioned formula (b1), a carboxy group protected by an acid-dissociable dissolution-inhibiting group included in units represented by the above-mentioned formulae (b5) and (b6). From the viewpoint of the solubility into a developing solution in a deprotection state, R is preferably the carboxy group protected by the acid-dissociable dissolution-inhibiting group included in the units represented by the above-mentioned formulae (b5) and (b6).

As the carboxy group protected by the acid-dissociable dissolution-inhibiting group included in the units represented by the above-mentioned formulas (b5) and (b6), carboxy groups protected by an acid-dissociable dissolution-inhibiting group included in the units represented by the formulae (b5-1) to (b5-33) and the formulae (b6-1) to (b6-25) are preferable.

As the compound represented by the formula (1) described above, compounds represented by the following formula (2) are preferable.

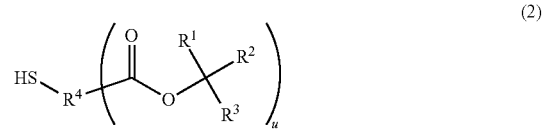

(2)

(In the formula, $R^1$, $R^2$ and $R^3$ each independently represent a linear or branched alkyl group or an aliphatic cyclic group having 5 to 20 carbon atoms, and $R^2$ and $R^3$ may be bonded to each other to form a ring together with a carbon atom to which both are bonded, $R^4$ represents an aliphatic group having a valency of u+1 optionally containing an atom other than a carbon atom; and u represents an integer of 1 to 3).

When $R^1$, $R^2$ and $R^3$ are a linear or branched alkyl group, the number of carbon atoms of the alkyl group is preferably 1 to 10, and more preferably 1 to 6. When $R^2$ and $R^3$ are bonded to each other to form a ring together with a carbon atom to which both are bonded, the number of carbon atoms of the formed ring is preferably 5 to 20.

Preferable examples of $R^1$, $R^2$ and $R^3$, which are a linear or branched alkyl group, include a methyl group, an ethyl group, a propyl group, an isopropyl group, an n-butyl group, an isobutyl group, a tert-butyl group, a pentyl group, an isopentyl group, a neopentyl group, and the like. Specific examples of $R^1$, $R^2$ and $R^3$, which are an aliphatic cyclic group, include groups in which one or more hydrogen atoms are removed from monocycloalkane; and polycycloalkane such as bicycloalkane, tricycloalkane and tetracycloalkane. Specific examples include a group in which one hydrogen atom is removed from monocycloalkane such as cyclopentane, cyclohexane, cycloheptane, and cyclooctane; and polycycloalkane such as adamantane, norbornane, isobornane, tricyclodecane and tetracyclododecane. In particular, a group (optionally further having a substituent) in which one hydrogen atom is removed from cyclohexane and adamantane is preferable.

Specific examples of the aliphatic cyclic group formed by bond of $R^2$ and $R^3$ preferably include a group in which one or more hydrogen atoms are removed from monocycloalkane, and polycycloalkane such as bicycloalkane, tricycloalkane and tetracycloalkane. Specific examples include a group in which one hydrogen atom is removed from monocycloalkane such as cyclopentane, cyclohexane, cycloheptane, and cyclooctane, and polycycloalkane such as adamantane, norbornane, isobornane, tricyclodecane and tetracyclododecane. In particular, a group (optionally further having a substituent) in which one hydrogen atom is removed from cyclohexane and adamantane is preferable.

Preferable examples of $R^4$ include groups described in the case where Y in the formula (1) is an aliphatic hydrocarbon group, a group in which two or more aliphatic hydrocarbon groups are bonded together via an ether bond or an ester bond, and an aliphatic heterocyclic group.

As the compound represented by the formula (2), compounds in which u is 1 and $R^4$ is a divalent aliphatic hydrocarbon group are preferable because they are easily prepared and available and, particularly, are less likely to denature the surface of the metal substrate. The number of carbon atoms of $R^4$ is preferably 1 to 10, and more preferably 1 to 6.

When $R^4$ is a divalent aliphatic hydrocarbon group, preferable examples of $R^4$ include a methylene group, an ethane-1,2-diyl group, an ethane-1,1-diyl group, a propane-1,3-diyl group, a propane-1,2-diyl group, a propane-1,1-diyl group, a butane-1,4-diyl group, a butane-1,3-diyl group, a butane- 1,2-diyl group, a butane-1,1-diyl group, a butane-2,3-diyl group, a butane-2,2-diyl group, a 2-methyl propane-1,3-diyl group, a 2-methyl propane-1,2-diyl group, a 2-methyl propane-1,1-diyl group, a pentane-1,5-diyl group, a pentane-1,4-diyl group, a pentane-1,3-diyl group, a pentane-1,2-diyl group, a pentane-1,1-diyl group, a pentane 2,4-diyl group, a pentane-2,3-diyl group, a pentane-2,2-diyl group, a pentane-3,3-diyl group, a hexane-1,6-diyl group, a hexane-1,5-diyl group, a hexane-1,4-diyl group, a hexane-1,3-diyl group, a hexane-1,2-diyl group, a hexane-1,1-diyl group, a hexane-2,5-diyl group, a hexane-2,4-diyl group, a hexane-2,3-diyl group, a hexane-2,2-diyl group, a hexane-3,4-diyl group, and a hexane-3,3-diyl group.

When $R^4$ is a divalent aliphatic hydrocarbon group, $R^4$ is more preferably a methylene group, an ethane-1,2-diyl group, a propane-1,3-diyl group, a butane-1,4-diyl group, a pentane-1,5-diyl group, a hexane-1,6-diyl group, and a hexane-1,1-diyl group, and particularly preferably a methylene group, an ethane-1,2-diyl group, a propane-1,3-diyl group.

Preferable examples of the mercapto compound represented by the formula (1) include the following compounds.

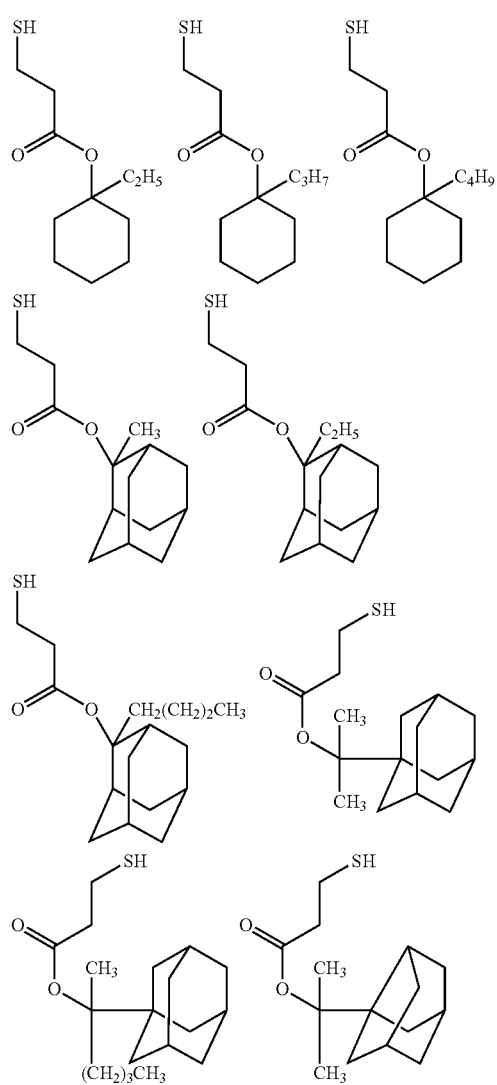

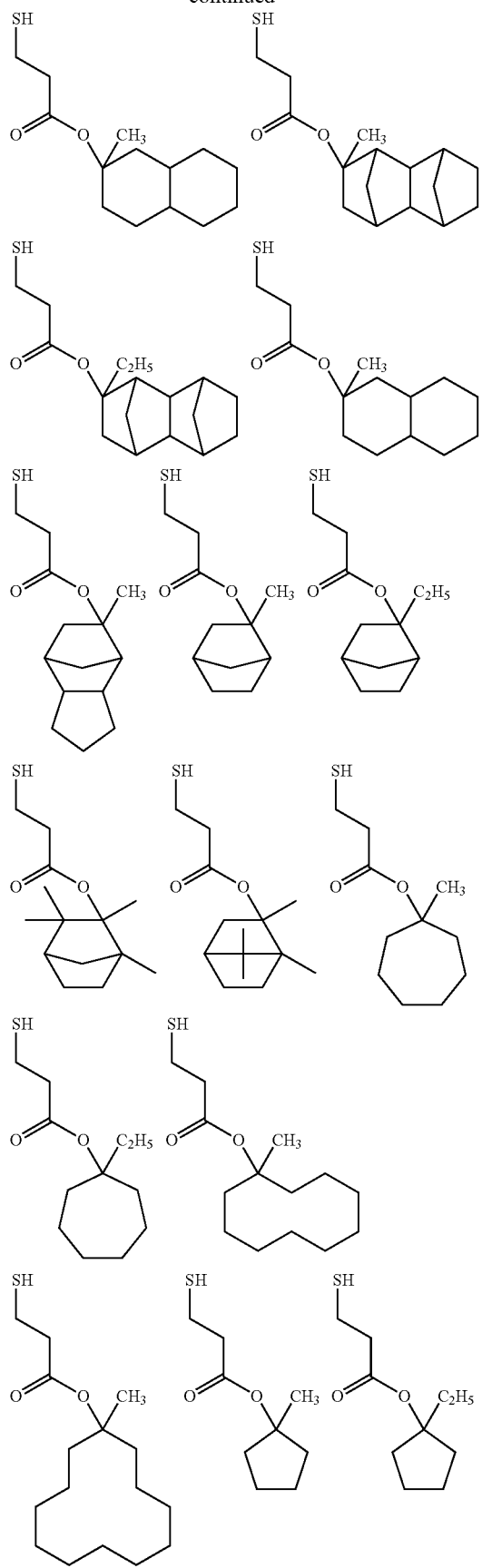

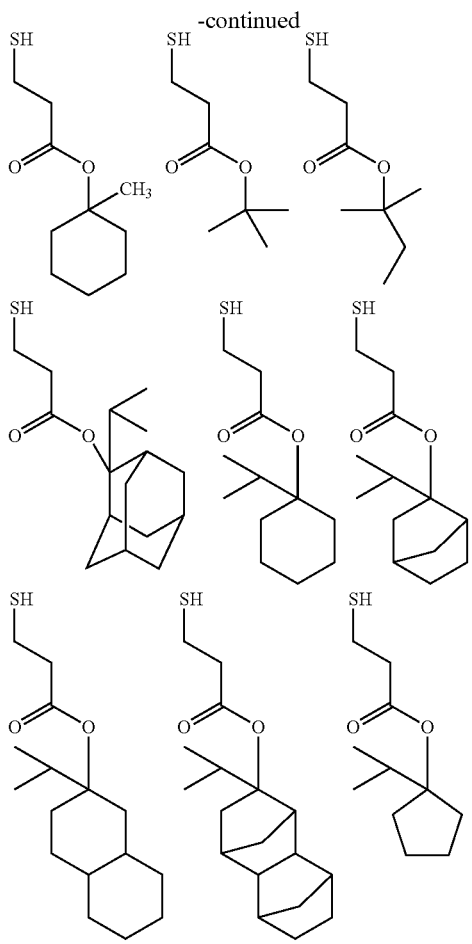

The (C) mercapto compound is preferably used in a range of 0.01 to 5 parts by mass relative to the total mass of 100 parts by mass of the above (B) resin and the (D) alkali soluble resin described below, and in particular preferably in a range of 0.05 to 2 parts by mass. When the addition amount of the (C) mercapto compound is 0.01 parts by mass or more, footing can be effectively controlled. When the addition amount is 5 parts by mass or less, a good plated article can be formed.

When pattern formation is carried out by using a positive-type photosensitive resin composition including an (A) acid generator that produces an acid when irradiated with an active ray or radiation, and a (B) resin whose solubility in alkali increases under the action of acid, it is considered that acids generated from the (A) acid generator at the time of exposure are deactivated in the vicinity of the surface of the substrate. In particular, in the vicinity of the interface between an exposed section and unexposed section, in which the acid concentration is low, the "footing" tends to occur due to the influence of deactivation of acids on the surface of the substrate. In this respect, when the photosensitive composition includes a mercapto compound, deactivation of acids on the surface of the substrate is easily suppressed, resulting in easily suppressing the footing. However, the mercapto compound itself is less soluble in an alkali developing solution. Therefore, a problem may arise that residues easily occur at the time of development when the photosensitive composition includes a mercapto compound. In order to solve such a problem, it is possible that an alkali-soluble group such as a carboxy group may be used as the mercapto compound. However, when a mercapto compound having an alkali-soluble group such as a carboxy group is blended with the photosensitive composition, when the coating film of the photosensitive composition formed on the surface of the substrate is pre-baked (for example, at 150° C. for about 5 minutes), metal on the surface of the substrate tends to be denatured. This appears to be attributable to the following reasons. Firstly, a mercapto group tend to bond to metal. Thus, by interaction between the mercapto group and metal, a mercapto compound having an alkali-soluble group such as a carboxy group is abundant in the vicinity of the surface of the substrate made of metal. As a result, the alkali-soluble group such as a carboxy group of the mercapto compound has a strong effect on denaturation of metal on the surface of the substrate. As mentioned above, it has been difficult to achieve all of suppression of footing, suppression of occurrence of residues after development, and suppression of denaturation of the metal on the surface of the substrate. However, use of an acid decomposition group whose solubility in alkali increases under the action of acid and the above-mentioned (C) mercapto compound having a mercapto group enables the suppression of footing, suppression of occurrence of residues after development, and suppression of denaturation of the metal on the surface of the substrate to be achieved. This is because the use of the (C) mercapto compound suppresses the footing, while the (C) mercapto compound has a protected alkali-soluble group, and therefore, denaturation of the substrate at the time of prebaking is suppressed, and the (C) mercapto compound becomes soluble in an alkali developing solution after exposure.

<(D) Alkali-Soluble Resin>

It is preferred that the photosensitive resin composition further contains a (D) alkali-soluble resin in order to improve crack resistance. The alkali-soluble resin as referred to herein may be determined as follows. A solution of the resin to give a resin concentration of 20% by mass (solvent: propylene glycol monomethyl ether acetate) is used to form a resin film having a film thickness of 1 μm on a substrate, and immersed in an aqueous 2.38% by mass TMAH solution for 1 min. If the resin was dissolved in an amount of no less than 0.01 μm, the resin is defined to be alkali soluble. The (D) alkali-soluble resin is preferably at least one selected from the group consisting of (D1) novolak resin, (D2) polyhydroxystyrene resin and (D3) acrylic resin.

[(D1) Novolak Resin]

The (D1) novolak resin may be prepared by addition condensation between, for example, aromatic compounds having a phenolic hydroxy group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the aldehydes include formaldehyde, furfural, benzaldehyde, nitrobenzaldehyde, acetaldehyde, and the like. The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxide group in the resins is substituted with other substituents, or bulky aldehydes are used.

The mass average molecular weight [sic] of (D1) novolac resin is not particularly limited as long as the purpose of the present invention is not impaired, but the mass average molecular weight is preferably 1,000 to 50,000.

[(D2) Polyhydroxystyrene Resin]

The hydroxystyrene compound to constitute the (D2) polyhydroxystyrene resin is exemplified by p-hydroxystyrene, α-methylhydroxystyrene, α-ethylhydroxystyrene, and the like. Among these, the (D2) polyhydroxystyrene resin (C2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the (D2) polyhydroxystyrene resin is not particularly limited as long as the purpose of the present invention is not impaired, but the mass average molecular weight is preferably 1,000 to 50,000.

[(D3) Acrylic Resin]

It is preferred that the (D3) acrylic resin includes a structural unit derived from a polymerizable compound having an ether linkage and a structural unit derived from a polymerizable compound having a carboxyl group.

Illustrative examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether linkage is preferably, 2-methoxyethyl acrylate, and methoxytriethylene glycol acrylate. These polymerizable compounds may be used alone, or in combinations of two or more.

Illustrative examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the (D3) acrylic resin is not particularly limited as long as the purpose of the present invention is not impaired, but the mass average molecular weight is preferably 50,000 to 800,000.

The content of (D) alkali-soluble resin is such that when the total amount of the (B) resin and the (D) alkali-soluble resin is taken as 100 parts by mass, the content is preferably 0 parts to 80 parts by mass, and more preferably 0 parts to 60 parts by mass. By adjusting the content of the (D) alkali-soluble resin (D) to the range described above, there is a tendency for resistance to cracking to increase, and film loss at the time of development can be prevented.

<(E) Acid Diffusion Control Agent>

In order to improve the resist pattern configuration, the post-exposure delay stability and the like, it is preferred that the photosensitive resin composition further contains an (E) acid diffusion control agent. The (E) acid diffusion control agent is preferably an (E1) anitrogen-containing compound, and an (E2) organic carboxylic acid, or an oxo acid of phosphorus or a derivative thereof may be further included as needed.

[(E1) Nitrogen-Containing Compound]

Examples of the (E1) nitrogen-containing compound include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine and the like. These may be used alone, or in combinations of two or more thereof.

The (E1) nitrogen-containing compound may be used in an amount typically in the range of 0 to 5 parts by mass, and particularly in the range of 0 to 3 parts by mass, with respect to 100 parts by mass of total mass of the (B) resin and the (D) alkali-soluble resin.

[(E2) Organic Carboxylic Acid or Oxo Acid of Phosphorus or Derivative Thereof]

Among the (E2) organic carboxylic acid, or the oxo acid of phosphorus or the derivative thereof, specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The (E2) organic carboxylic acid, or the oxo acid of phosphorus or the derivative thereof may be used in an amount typically in the range of 0 to 5 parts by mass, and particularly in the range of 0 to 3 parts by mass, with respect to 100 parts by mass of total mass of the (B) resin and the (D) alkali-soluble resin.

Moreover, in order to form a salt to allow for stabilization, the (E2) organic carboxylic acid, or the oxo acid of phosphorous or the derivative thereof is preferably used in an amount equivalent to that of the (E1) nitrogen-containing compound.

<(S) Organic Solvent>

The photosensitive resin composition contains an (S) organic solvent. The kind of the (S) organic solvent is not particularly limited as long as the purpose of the present invention is not impaired, and the organic solvent can be appropriately selected for use from the organic solvents that have been conventionally used in positive-type photosensitive resin compositions.

Specific examples of the (S) organic solvent include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

The content of the (S) organic solvent is not particularly limited as long as the purpose of the present invention is not impaired. When the photosensitive resin composition is used for a thick-film application in which a photosensitive resin layer obtainable by a spin-coating method or the like has a film thickness of 10 μm or greater, it is preferable to use the (S) organic solvent to the extent that the solid concentration of the photosensitive resin composition is 30% to 55% by mass.

<Other Components>

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

<Method of Preparing Chemically Amplified Positive-Type Photosensitive Resin Composition>

The chemically amplified positive-type photosensitive resin composition is prepared by mixing and stirring the above components by the common method. Machines which can be used for mixing and stirring the above components include dissolvers, homogenizers, 3-roll mills and the like. After uniformly mixing the above components, the resulting mixture may further be filtered through a mesh, a membrane filter and the like.

<<Method of Manufacturing Substrate with Template>>

There is no particular limitation for the method of forming a resist pattern serving as a template for forming a plated article on a metal surface of a substrate by using the aforementioned photosensitive resin composition. Preferable methods include a method for manufacturing a substrate with a template, including:

forming a photosensitive resin layer including a photosensitive resin composition on a metal surface of a substrate having the metal surface, irradiating the photosensitive resin layer with an active ray or radiation to perform exposure, and developing the photosensitive resin layer after the exposure to create a template for forming a plated article.

There is no particular limitation for the substrate on which a photosensitive resin layer is formed, and conventionally known substrates can be used. Examples include substrates for electronic part, those on which a predetermined wire pattern is formed and the like. Those having a metal surface are used as the above substrate, and as metal species constituting a metal surface, copper, gold and aluminum are preferred, and copper is more preferred.

The photosensitive resin layer is formed on a substrate, for example, as follows. That is, a liquid photosensitive resin composition is applied on a substrate, and then a solvent is removed by heating to form a photosensitive resin layer having a desired film thickness. There is no particular limitation for the thickness of a photosensitive resin layer as long as it can form a resist pattern serving as a template which has a desired film thickness. There is no particular limitation for the film thickness, but it is preferably 10 μm or more, more preferably 10 to 150 μm, in particular preferably 20 to 120 μm, and most preferably 20 to 100 μm.

As a method of applying a photosensitive resin composition onto a substrate, those such as the spin coating method, the slit coat method, the roll coat method, the screen printing method and the applicator method can be used. Pre-baking is preferably performed on a photosensitive resin layer. The conditions of pre-baking may differ depending on the components in a photosensitive resin composition, the blending ratio, the thickness of a coating film and the like, but they are usually about 2 to 60 minutes at 70 to 150° C., preferably 80 to 140° C.

The photosensitive resin layer formed as described above is selectively irradiated (exposed) with an active ray or radiation, for example, an ultraviolet radiation or visible light with a wavelength of 300 to 500 nm through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, y-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 to 10,000 $mJ/cm^2$. The radiation includes a light ray to activate the (A) acid generator in order to generate an acid.

After the exposure, the diffusion of acid is promoted by heating the photosensitive resin layer using a known method to change the alkali solubility of the photosensitive resin layer at an exposed portion of the photosensitive resin film.

Subsequently, the exposed photosensitive resin layer is developed in accordance with a conventionally known method, and an unnecessary portion is dissolved and removed to form a predetermined resist pattern. At this time, an alkaline aqueous solution is used as a developing solution.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photosensitive resin composition, the film thickness of the photosensitive resin layer, and the like. Usually, the developing time is 1 to 30 min. The method of the development may be any one of a liquid-filling method, a dipping method, a paddle method, a spray developing method, and the like.

After development, it is washed with running water for 30 to 90 seconds, and then dried with an air gun, an oven and the like. As described above, a substrate having a resist pattern serving as a template on a metal surface of a substrate can be manufactured.

<<Method of Manufacturing a Plated Article>>

A conductor such as a metal may be embedded, by plating, into a nonresist section (a portion removed with a developing solution) in the template formed by the above method on the substrate to form a plated article, for example, like a contacting terminal such as a bump or a metal post. Note that there is no particular limitation for the method of plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

According to the above-mentioned method, a resist pattern serving as a template is formed while suppressing occurrence of "footing" in which the width of the bottom (the side proximate to the surface of a support) becomes narrower than that of the top (the side proximate to the surface of a resist layer) in a nonresist section, the denaturation of the surface of the metal substrate, and the occurrence of development residue. By using a substrate having a template which is manufactured as described above and in which footing is suppressed, a plated article having excellent adhesiveness to the substrate can be manufactured.

EXAMPLES

Below, the present invention will be described in more detail with reference to Examples, but the present invention shall not be limited to these Examples.

Preparation Example 1

(Synthesis of Mercapto Compound C1)

To 0.9979 g of tert-butyl acrylate, 1.811 g of thioacetic acid was dropped, and the resulting product was stirred at room temperature for 3 hours and reacted with each other. Subsequently, 20 g of 20% by mass aqueous solution of sodium hydrogen carbonate and 10 g of ethyl acetate were added into a reaction container. The content in the reaction container was stirred for 5 minutes, the content was separated into an organic layer and a water layer. The organic layer was fractionated, and concentrated under reduced pressure using a rotary evaporator to obtain 1.43 g of 3-acetylsulfanil propionic acid tert-butyl ester.

0.4987 g of 3-acetylsulfanil propionic acid tert-butyl ester was dissolved in 2 g of methanol. Subsequently, 0.5 g of 10% by mass aqueous solution of sodium hydroxide was added into a methanol solution, and the mixed solution was stirred for 2 hours. A saturated aqueous solution of ammonium chloride was added to a methanol solution, and neutralized, followed by extraction of 3-mercapto propionic acid tert-butyl ester as a product using ethyl acetate. An ethyl acetate layer was fractionated, concentrated by a rotary evaporator to obtain concentrated residue. The resulting concentrated residue was purified by silica gel column chromatography to obtain 0.212 g of a mercapto compound C1 (3-mercapto propionic acid tert-butyl ester) having the following structure.

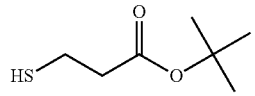

Mecapto Compound C1

Preparation Example 2

A mercapto compound C2 having the following structure was obtained in the same manner as in Preparation Example 1 except that tert-butyl acrylate was changed to acrylic acid ester of the following structure having an equal mol to tert-butyl acrylate.

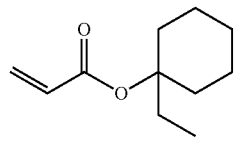

Raw Material (Acrylic Acid Ester)

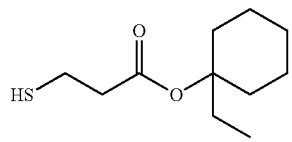

Mercapto Compound C2

Preparation Example 3

A mercapto compound C3 having the following structure was obtained in the same manner as in Preparation Example 1 except that tert-butyl acrylate was changed to acrylic acid ester of the following structure having an equal mol to tert-butyl acrylate.

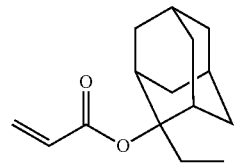

Raw Material (Acrylic Acid Ester)

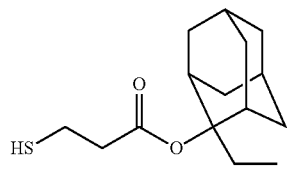

Mercapto Compound C3

Examples 1-6 and Comparative Examples 1-4

In Examples and Comparative Examples, a compound represented by the following formula was used as an (A) acid generator.

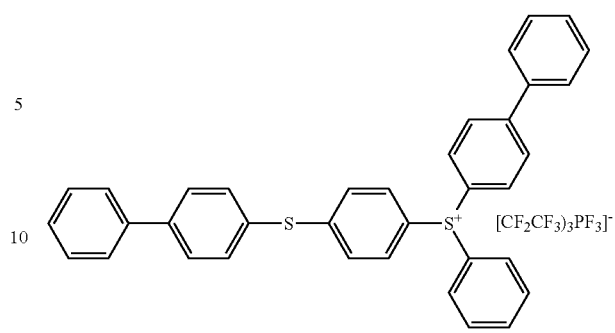

In Examples and Comparative Examples, the following resins B1 and B2 were used as the resin whose solubility in alkali increases under the action of acid ((B) resin). The number at the lower right of the parentheses in each constituent unit in the following structural formula represents the content (% by mole) of the constituent unit in each resin.

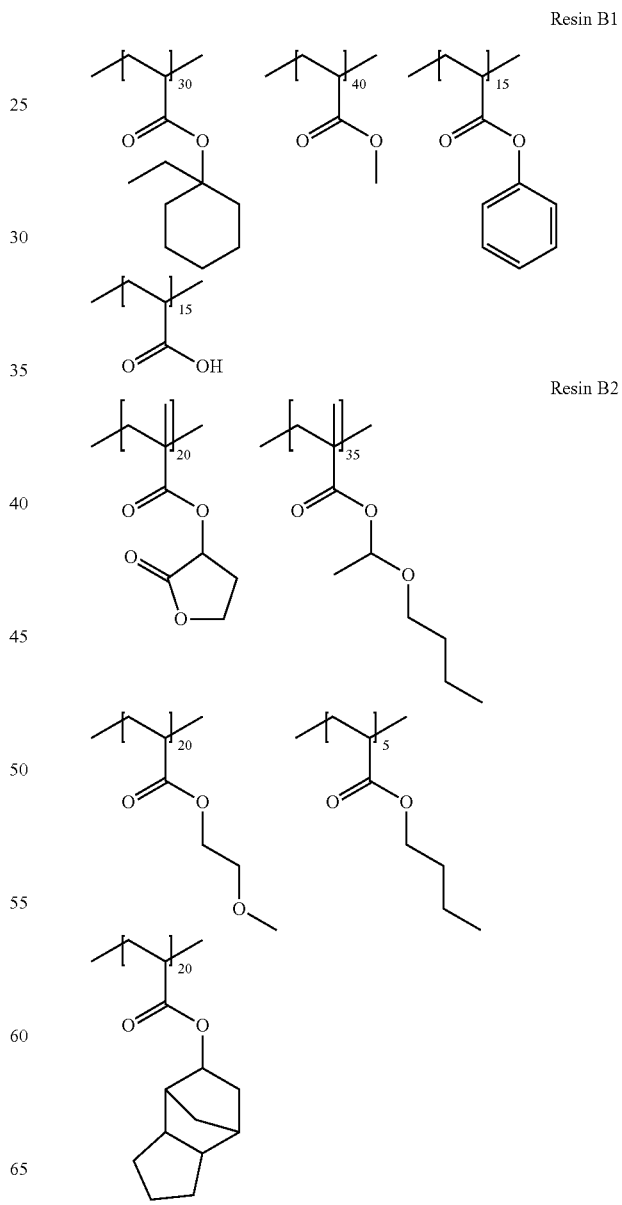

Resin B1

Resin B2

The following mercapto compounds C1 to C5, described below, were used as the mercapto compounds (C). As the mercapto compounds C1 to C3, the above-mentioned compounds obtained in Examples 1 to 3 were used. As the mercapto compound C4, 3-mercapto propionic acid was used. As the mercapto compound C5, 1-dodecane thiol was used.

The following resins D1 and D2 were used as the (D) alkali soluble resins. D1: A copolymer of polyhydroxystyrene resin (p-hydroxy styrene:styrene=85:15 (mass ratio), mass-average molecular weight (Mw): 2500) D2: A novolak resin (a novolak resin obtained by mixing m-cresol and p-cresol in m-cresol/p-cresol=60/40 (mass ratio), and performing addition condensation in the presence of formaldehyde and an acid catalyst (mass-average molecular weight (Mw): 8000))

The (B) resin, the (C) mercapto compound, and the (D) alkali soluble resin of types and amounts shown in Table 1, 2.0 parts by mass of the (A) acid generator, and 0.02 parts by mass of triphenyl amine were dissolved in methoxy butyl acetate so that the solid content concentration was 53% by mass. Then, each photosensitive resin composition from Examples and Comparative Examples was obtained. Note here that the use amounts of the (C) mercapto compound described in Table 1 are a value expressed by % by mass with respect to the total mass of the (B) the resin and (D) the alkali soluble resin.

The obtained photosensitive resin composition was evaluated in terms of footing, denaturation of the substrate, and development residues according to the following procedures. These evaluation results are shown in Table 1.

[Evaluation of Footing]

The photosensitive resin compositions from Examples and Comparative Examples were each applied on a copper substrate with a diameter of 8 inches to form a photosensitive resin layer having a film thickness of 50 μm. Then the photosensitive resin layers were pre-baked for 5 minutes at 150° C. After the pre-baking, using a mask having a hole pattern with a diameter of 60 μm and an exposure device Prisma GHI (Ultratech Inc.), pattern exposure was performed with the ghi line at an exposure level greater by 1.2 times than the minimum exposure level obtained from the evaluation of sensitivity. Subsequently, the substrate was mounted on a hot plate to perform post-exposure baking (PEB) for 3 minutes at 100° C. Then, a 2.38 weight % aqueous solution of tetramethylammonium hydroxide (a developing solution, NMD-3, Tokyo Ohka Kogyo Co., Ltd.) was added dropwise to the developed photosensitive resin layer, and allowed to stand for 60 seconds at 23° C. This was repeated the total of 4 times. Subsequently, the surface of the resist pattern was washed with running water, and blown with nitrogen to obtain a resist pattern. The cross-sectional shape of this resist pattern was observed under a scanning electron microscope to measure the amount of footing. Specifically, the amount of footing was measured as follows. FIG. 1 shows schematically illustrated cross-sections of a resist section and a nonresist section when measuring the amount of footing. In FIG. 1, a resist pattern having a resist section 12 and a nonresist section 13 (hole) is formed on a substrate 11. First, an inflexion point 15 at which footing on a side wall 14 starts was determined on the side wall 14 which is the interface between the resist section 12 and the nonresist section 13. A perpendicular line 16 was drawn down from the inflexion point 15 toward the surface of the substrate 11, and the intersection of the perpendicular line 16 and the surface of the substrate 11 was taken as a starting point of footing 17. Further, the intersection of the curve of the side wall 14 and the surface of the substrate 11 was taken as an endpoint of footing 18. A width Wf between the starting point of footing 17 and the endpoint of footing 18 defined as above was taken as the amount of footing. The amount of footing is a value measured for any one of the side walls 14 at any one of the nonresist sections in the resist pattern. The degree of footing was evaluated in accordance with the following criteria based on the obtained value for the amount of footing.

<Evaluation Criteria of Footing>
Good: 0 μm or more and 2 μm or less
Fair: more than 2 μm and 2.5 μm or less
Bad: more than 2.5 μm

[Evaluation of Substrate Denaturation]

A resist pattern was formed in the same manner as in the evaluation of the footing except that a photosensitive resin layer was not provided on a part of the copper substrate. The hue of the copper substrate in a hole in the resist pattern and the hue of the section on the copper substrate in which photosensitive resin layer was not provided were compared by observation under microscope. The case where a clear difference was not observed was evaluated as "Good", and the case where a clear difference was observed was evaluated as "Bad".

[Evaluation of Development Residues]

In the evaluation of footing, the cross-sectional shape of the resist pattern was observed under a scanning electron microscope. Then, presence or absence of development residues on the surface of copper substrate exposed in the nonresist section was assessed. The case where no development residues was observed was evaluated as "Good" and the case where development residue was observed was evaluated as "Bad".

TABLE 1

| | (B) Resin Type/ % by mass | (D) Alkali soluble resin Type/ % by mass | (C) Mercapto compound Type/ % by mass | Foot- ing | Sub- strate dena- turation | Develop- ment residues |
|---|---|---|---|---|---|---|
| Ex. 1 | B1/40 | D1/20 D2/40 | C1/ 0.065 | Good | Good | Good |
| Ex. 2 | B1/40 | D1/20 D2/40 | C1/ 0.032 | Good | Good | Good |
| Ex. 3 | B1/40 | D1/20 D2/40 | C1/ 0.130 | Good | Good | Good |
| Ex. 4 | B1/40 | D1/20 D2/40 | C2/ 0.113 | Good | Good | Good |
| Ex. 5 | B1/40 | D1/20 D2/40 | C3/ 0.108 | Good | Good | Good |
| Ex. 6 | B2/100 | — | C1/ 0.065 | Good | Good | Good |
| Comp. Ex. 1 | B1/40 | D1/20 D2/40 | — | Bad | Good | Good |
| Comp. Ex. 2 | B2/100 | — | — | Bad | Good | Good |
| Comp. Ex. 3 | B1/40 | D1/20 D2/40 | C4/ 0.032 | Bad | Bad | Good |
| Comp. Ex. 4 | B1/40 | D1/20 D2/40 | C5/ 0.100 | Good | Good | Bad |

Examples 1 to 6 show that when the resist pattern was formed using a positive-type photosensitive resin composition further including the (C) mercapto compound represented by the formula (1) mentioned above in addition to the (A) acid generator that produces an acid when irradiated with an active ray or radiation and the (B) resin whose solubility in alkali increases under the action of acid, footing, denaturation on the surface of the substrate, and occurrence of development residue are suppressed in the resist pattern. The denaturation on the surface of the substrate seems to undergo the adverse effect by a carboxy group of the (C) mercapto compound when baking is carried out at 150° C. for 5 minutes in the stage in which the coating film (photosensitive resin layer) was formed. In Examples, when the coating film was baked at 150° C. for 5 minutes, the carboxy group of the (C) mercapto compound was protected by an acid-dissociable dissolution-inhibiting group. Therefore, in Examples, it is considered that denaturation on the surface of the substrate does not occur.

Note here that it is considered that a mercapto group tends to bond to metal, by interaction between the mercapto group and metal, the (C) mercapto compound is abundant in the vicinity of the surface of the metal substrate. Therefore, when the (C) mercapto compound has a carboxy group, it is considered that the carboxy group of the (C) mercapto compound has a strong effect on denaturation on the surface of the metal substrate.

What is claimed is:

1. A chemically amplified positive-type photosensitive resin composition, comprising:
   (A) an acid generator that produces an acid when irradiated with an active ray or radiation;
   (B) a resin whose solubility in alkali increases under an action of acid;
   (C) a mercapto compound; and
   (D1) a novolak resin as a (D) alkali-soluble resin, wherein the (C) mercapto compound is contained in an amount of 0.01 to 5 parts by mass relative to the total mass of 100 parts by mass of the (B) resin and the (D) alkali soluble resin, wherein the (C) mercapto compound is represented by the following formula (1):

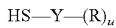  (1)

wherein R represents an acid decomposition group whose solubility in alkali increases under the action of acid; Y represents a linking group having a valency of u+1; and u represents an integer of 1 to 3.

2. The chemically amplified positive-type photosensitive resin composition according to claim 1, wherein the (C) mercapto compound is a compound represented by the formula (2):

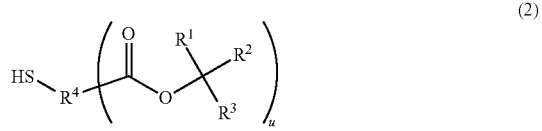

wherein $R^1$, $R^2$ and $R^3$ each independently represent a linear or branched alkyl group; $R^2$ and $R^3$ may be bonded to each other to form a ring together with a carbon atom to which both are bonded; $R^4$ represents an aliphatic group having a valency of u+1 optionally containing an atom other than a carbon atom; and u represents an integer of 1 to 3.

3. A method for manufacturing a substrate with a template, comprising:
   forming a photosensitive resin layer on a metal surface of a substrate having the metal surface, the photosensitive resin layer comprising the chemically amplified positive-type photosensitive resin composition according to claim 1;
   irradiating the photosensitive resin layer with an active ray or radiation to perform exposure; and
   developing the photosensitive resin layer after the exposure to create a template for forming a plated article.

4. A method for manufacturing a plated article, the method comprising: plating the substrate with the template manufactured by the method according to claim 3 to form the plated article within the template.

5. The chemically amplified positive-type photosensitive resin composition according to claim 1, wherein an amount of the (C) mercapto compound is 0.05 to 2 parts by mass relative to the total mass of 100 parts by mass of the (B) resin and the (D) alkali soluble resin.

* * * * *